US012568706B2

(12) United States Patent
Yang et al.

(10) Patent No.: US 12,568,706 B2
(45) Date of Patent: Mar. 3, 2026

(54) SEMICONDUCTOR DEVICE INCLUDING IMAGE SENSOR AND METHODS OF FORMING THE SAME

(71) Applicant: TAIWAN SEMICONDUCTOR MANUFACTURING COMPANY, LTD., Hsinchu (TW)

(72) Inventors: Ming-Hsien Yang, Taichung (TW); Chun-Hao Chou, Tainan (TW); Kuo-Cheng Lee, Tainan (TW); Chung-Liang Cheng, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 692 days.

(21) Appl. No.: 17/583,289

(22) Filed: Jan. 25, 2022

(65) Prior Publication Data

US 2023/0049255 A1 Feb. 16, 2023

Related U.S. Application Data

(60) Provisional application No. 63/232,606, filed on Aug. 12, 2021.

(51) Int. Cl.
H01L 23/522 (2006.01)
H01L 23/00 (2006.01)
(Continued)

(52) U.S. Cl.
CPC ....... H10F 39/809 (2025.01); H01L 23/5223 (2013.01); H01L 24/08 (2013.01);
(Continued)

(58) Field of Classification Search
CPC ......... H01L 27/14634; H01L 27/14636; H01L 27/1469; H01L 24/08; H01L 2224/80895;
(Continued)

(56) References Cited

U.S. PATENT DOCUMENTS 8,741,732 B2 6/2014 Wu et al.
8,802,504 B1 8/2014 Hou et al.
(Continued)

*Primary Examiner* — Zandra V Smith
*Assistant Examiner* — Douglas Yap
(74) *Attorney, Agent, or Firm* — NZ Carr Law Office

(57) ABSTRACT

A semiconductor device is provided. The device comprises first semiconductor wafer comprising first BEOL structure disposed on first side of first substrate, the first BEOL structure comprising first metallization layer disposed over the first substrate, second metallization layer disposed over the first metallization layer, first storage device disposed between the first and second metallization layers, and first transistor contacting the first storage device, and a first bonding layer disposed over the first BEOL structure. The device also comprises second semiconductor wafer comprising second BEOL structure disposed on first side of second substrate, the second BEOL structure comprising third metallization layer disposed over the second substrate, fourth metallization layer disposed over the third metallization layer, second storage device disposed between the third and fourth metallization layers, and second transistor contacting the second storage device, and second bonding layer disposed over the second BEOL structure and contacting the first bonding layer.

18 Claims, 19 Drawing Sheets

(51) Int. Cl.
　　*H04N 25/79*　　　　(2023.01)
　　*H10F 39/00*　　　　(2025.01)

(52) U.S. Cl.
　　CPC ........... *H01L 24/80* (2013.01); *H10F 39/018*
　　　　(2025.01); *H10F 39/811* (2025.01); *H01L*
　　　　*2224/08145* (2013.01); *H01L 2224/80895*
　　　　(2013.01); *H01L 2224/80896* (2013.01); *H01L*
　　　　*2924/13069* (2013.01); *H04N 25/79* (2023.01)

(58) Field of Classification Search
　　CPC ..... H01L 2224/80896; H01L 21/76898; H01L
　　　　24/80–89; H01L 2224/08145–08148;
　　　　H01L 23/5222–5225; H01L 2924/13069;
　　　　H04N 25/79; H10B 12/50; H10B 80/00;
　　　　H10F 39/018; H10F 39/809; H10F
　　　　39/811; H10D 30/031–0327; H10D
　　　　30/67–6758
　　See application file for complete search history.

(56)　　　　　References Cited

U.S. PATENT DOCUMENTS

| 8,803,292 | B2 | 8/2014 | Chen et al. | |
|---|---|---|---|---|
| 8,803,316 | B2 | 8/2014 | Lin et al. | |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 2007/0207592 | A1* | 9/2007 | Lu | H10D 88/01 |
| | | | | 438/455 |
| 2012/0181657 | A1* | 7/2012 | Wu | H01L 21/7687 |
| | | | | 257/532 |
| 2014/0104473 | A1* | 4/2014 | Kim | H04N 25/76 |
| | | | | 348/308 |
| 2017/0170224 | A1* | 6/2017 | Huang | H10D 88/01 |
| 2019/0123088 | A1* | 4/2019 | Kwon | H10F 39/802 |
| 2019/0181175 | A1 | 6/2019 | Huang | |
| 2021/0125990 | A1* | 4/2021 | Gomes | H10D 30/6755 |
| 2022/0208823 | A1* | 6/2022 | Yoshida | H10F 39/018 |

* cited by examiner

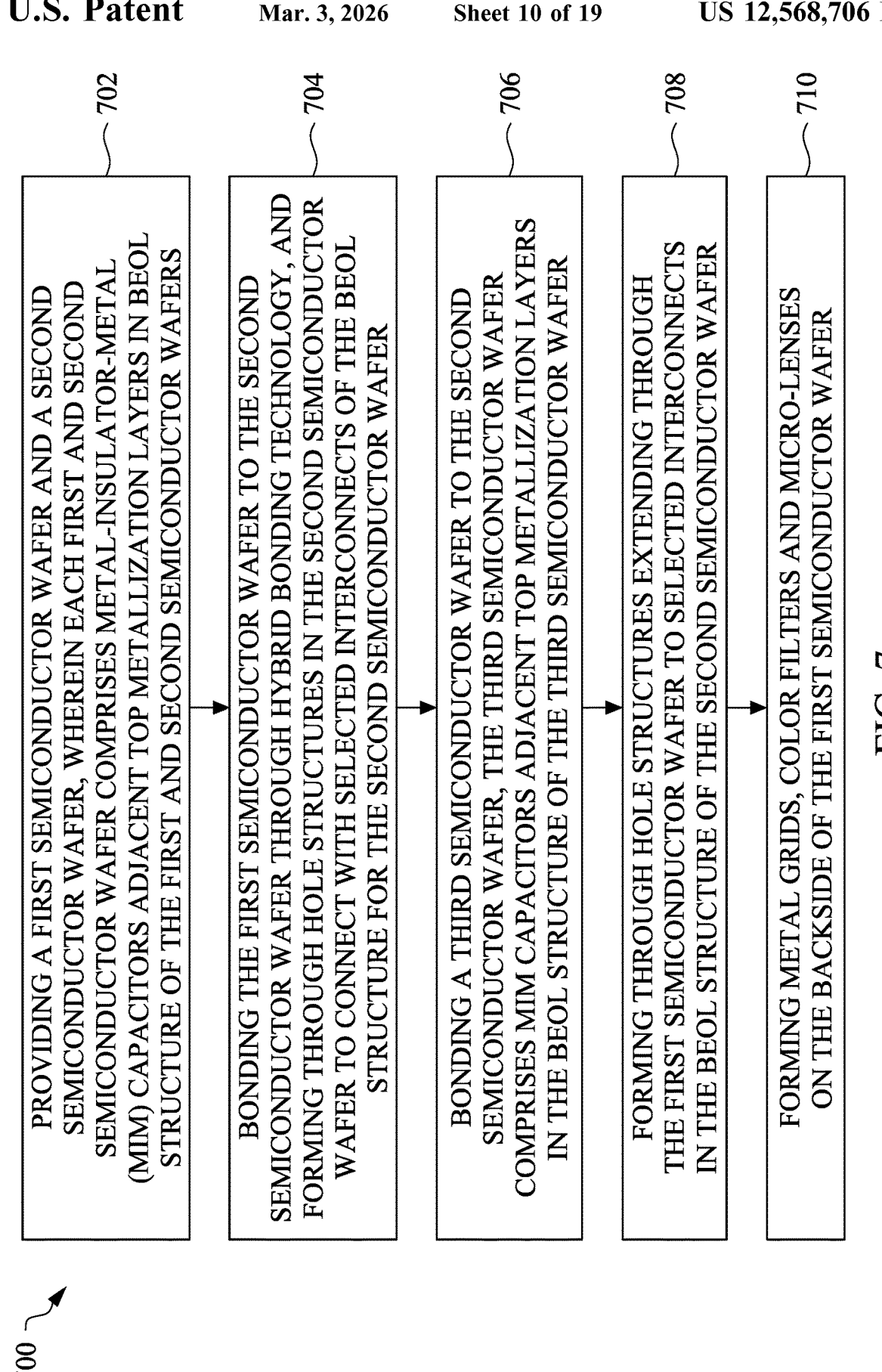

700

702

PROVIDING A FIRST SEMICONDUCTOR WAFER AND A SECOND SEMICONDUCTOR WAFER, WHEREIN EACH FIRST AND SECOND SEMICONDUCTOR WAFER COMPRISES METAL-INSULATOR-METAL (MIM) CAPACITORS ADJACENT TOP METALLIZATION LAYERS IN BEOL STRUCTURE OF THE FIRST AND SECOND SEMICONDUCTOR WAFERS

704

BONDING THE FIRST SEMICONDUCTOR WAFER TO THE SECOND SEMICONDUCTOR WAFER THROUGH HYBRID BONDING TECHNOLOGY, AND FORMING THROUGH HOLE STRUCTURES IN THE SECOND SEMICONDUCTOR WAFER TO CONNECT WITH SELECTED INTERCONNECTS OF THE BEOL STRUCTURE FOR THE SECOND SEMICONDUCTOR WAFER

706

BONDING A THIRD SEMICONDUCTOR WAFER TO THE SECOND SEMICONDUCTOR WAFER, THE THIRD SEMICONDUCTOR WAFER COMPRISES MIM CAPACITORS ADJACENT TOP METALLIZATION LAYERS IN THE BEOL STRUCTURE OF THE THIRD SEMICONDUCTOR WAFER

708

FORMING THROUGH HOLE STRUCTURES EXTENDING THROUGH THE FIRST SEMICONDUCTOR WAFER TO SELECTED INTERCONNECTS IN THE BEOL STRUCTURE OF THE SECOND SEMICONDUCTOR WAFER

710

FORMING METAL GRIDS, COLOR FILTERS AND MICRO-LENSES ON THE BACKSIDE OF THE FIRST SEMICONDUCTOR WAFER

FIG. 7

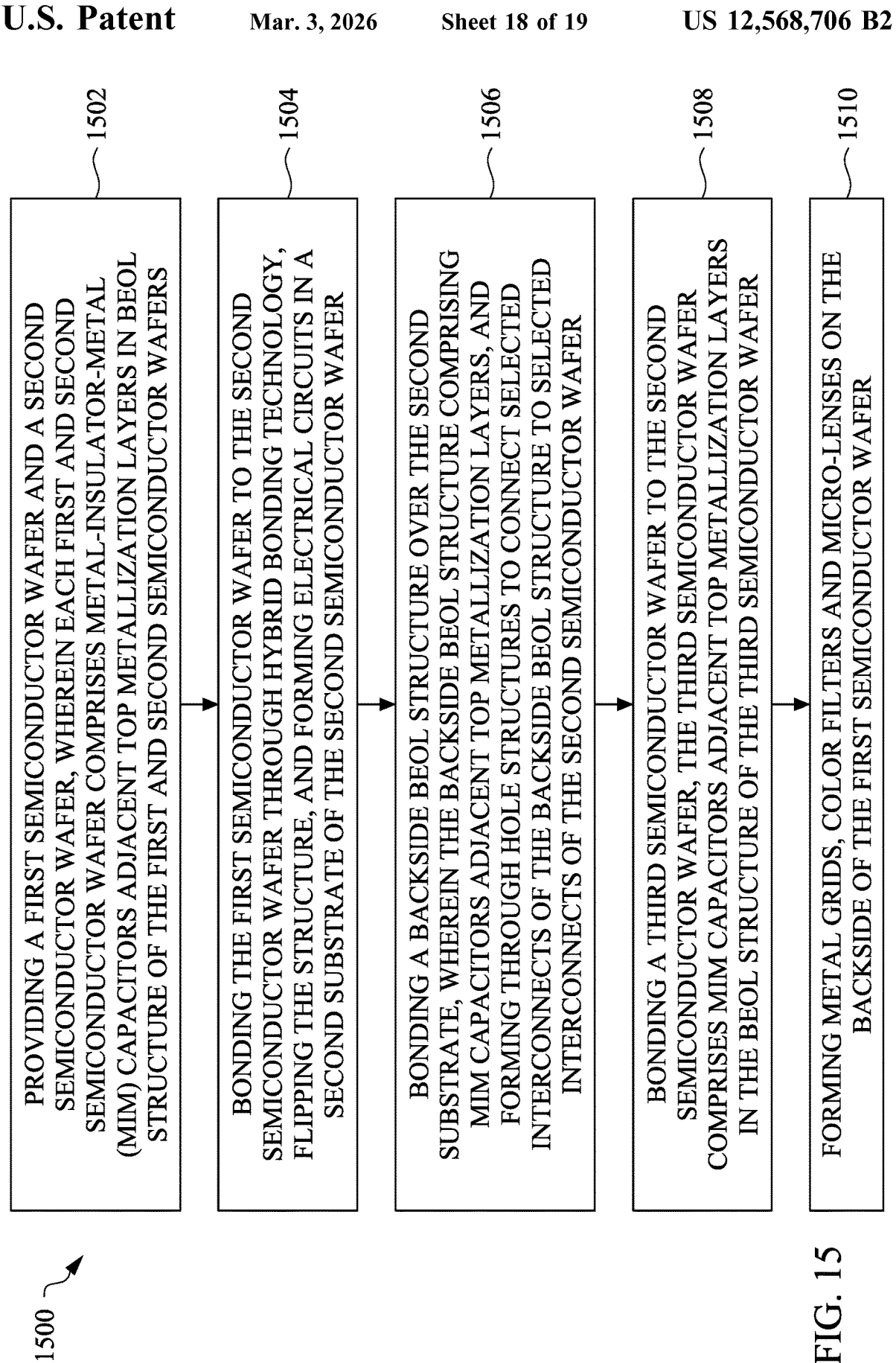

1502 PROVIDING A FIRST SEMICONDUCTOR WAFER AND A SECOND SEMICONDUCTOR WAFER, WHEREIN EACH FIRST AND SECOND SEMICONDUCTOR WAFER COMPRISES METAL-INSULATOR-METAL (MIM) CAPACITORS ADJACENT TOP METALLIZATION LAYERS IN BEOL STRUCTURE OF THE FIRST AND SECOND SEMICONDUCTOR WAFERS

1504 BONDING THE FIRST SEMICONDUCTOR WAFER TO THE SECOND SEMICONDUCTOR WAFER THROUGH HYBRID BONDING TECHNOLOGY, FLIPPING THE STRUCTURE, AND FORMING ELECTRICAL CIRCUITS IN A SECOND SUBSTRATE OF THE SECOND SEMICONDUCTOR WAFER

1506 BONDING A BACKSIDE BEOL STRUCTURE OVER THE SECOND SUBSTRATE, WHEREIN THE BACKSIDE BEOL STRUCTURE COMPRISING MIM CAPACITORS ADJACENT TOP METALLIZATION LAYERS, AND FORMING THROUGH HOLE STRUCTURES TO CONNECT SELECTED INTERCONNECTS OF THE BACKSIDE BEOL STRUCTURE TO SELECTED INTERCONNECTS OF THE SECOND SEMICONDUCTOR WAFER

1508 BONDING A THIRD SEMICONDUCTOR WAFER TO THE SECOND SEMICONDUCTOR WAFER, THE THIRD SEMICONDUCTOR WAFER COMPRISES MIM CAPACITORS ADJACENT TOP METALLIZATION LAYERS IN THE BEOL STRUCTURE OF THE THIRD SEMICONDUCTOR WAFER

1510 FORMING METAL GRIDS, COLOR FILTERS AND MICRO-LENSES ON THE BACKSIDE OF THE FIRST SEMICONDUCTOR WAFER

SEMICONDUCTOR DEVICE INCLUDING IMAGE SENSOR AND METHODS OF FORMING THE SAME

BACKGROUND

Optical imaging devices such as digital cameras or mobile phone cameras employ image sensors. Image sensors convert optical images to digital data that may be represented as digital images. An image sensor typically includes an array of pixel sensors which absorb radiation and convert the sensed radiation into electrical signals. As the size of transistor devices shrinks with each technology generation, further improvements are needed for increased processing of the optical images and device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6 are cross-sectional views of various processing steps of manufacturing a semiconductor device according to embodiments of the present disclosure.

FIG. 7 is a flow diagram illustrating a method of manufacturing the semiconductor device of FIG. 6 in accordance with some embodiments of the present disclosure.

FIG. 15 is a flow diagram illustrating a method of manufacturing the semiconductor device of FIG. 14 in accordance with some embodiments of the present disclosure.

DETAILED DESCRIPTION

Figure 1:
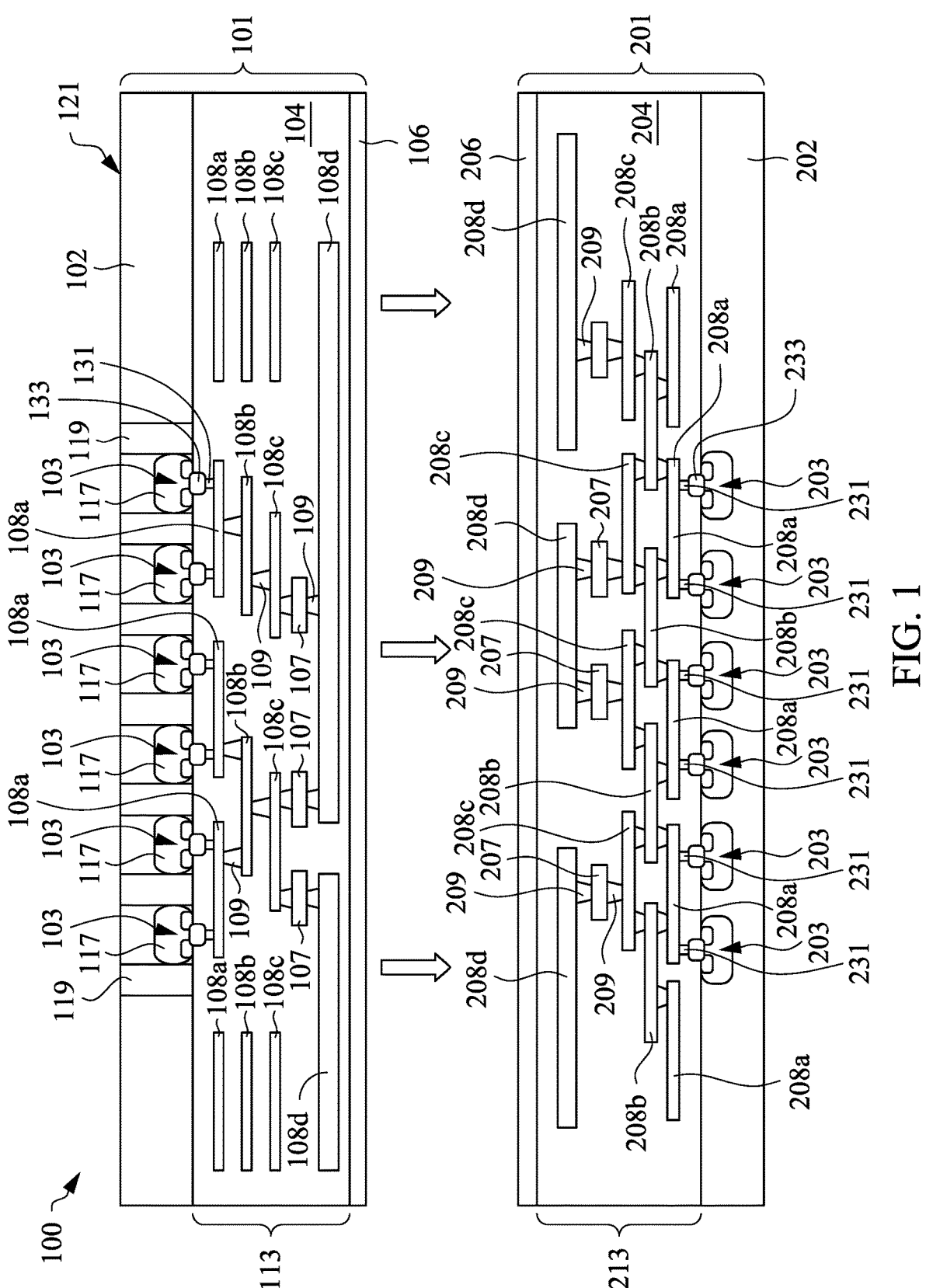

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure generally relate to an improved semiconductor device, particularly to a three-dimensional (3D) stacked complementary metal oxide semiconductor (CMOS) image sensor (CIS) device structure. The CIS device structure includes at least a System-on-Chip (SOC) wafer comprising an array of pixel sensors, a first Application-Specific Integrated Circuit (ASIC) wafer, and a second ASIC wafer. One or more storage devices, such as metal-insulator-metal (MIM) capacitors, are provided in the first, second, and third wafers and in electrical communication with the pixel sensors. A plurality of through hole structures such as through-silicon-via (TSV), through-oxide-via (TOV), through-insulator-via (TIV), or big through-silicon-via (BTSV), are formed to connect the first and second wafers, or the second and third wafers. Each storage device may be connected to a control node transistor to manage photodiode signal for image processing. Various embodiments are discussed in more detail below.

FIGS. 1-6 are cross-sectional views of various processing steps of manufacturing a semiconductor device 100 (FIG. 7) according to embodiments of the present disclosure. FIG. 7 is a flow diagram illustrating a method 700 of manufacturing the semiconductor device 100 in accordance with some embodiments of the present disclosure. The semiconductor device 100 may serve as an image sensor device, such as a backside illuminated (BSI) image sensor device. It is understood that additional operations can be provided before, during, and after the method shown in FIG. 7, and some of the operations described below can be replaced or eliminated, for additional embodiments of the method. The order of the operations/processes is not limiting and may be interchangeable.

At operation 702, a first semiconductor wafer 101 and a second semiconductor wafer 201 are provided. FIG. 1 shows a manufacturing stage of the first semiconductor wafer 101 and the second semiconductor wafer 201 prior to a bonding process in accordance with various embodiments. In one embodiment, the second semiconductor wafer 201 has similar features as the first semiconductor wafer 101, and for the purpose of the following discussion, the features of the second semiconductor wafer 201 having reference numerals of the form "2xx" are similar to features of the first semiconductor wafer 101 having reference numerals of the form "1xx." Various elements of the first semiconductor wafer 101 and the second semiconductor wafer 201 will be referred to as the "first <element>1xx" and the "second <element>2xx," respectively. In addition, the present disclosure may repeat reference numerals and/or letters in the various examples. This repetition is for the purpose of simplicity and clarity and does not in itself dictate a relationship between the various embodiments and/or configurations discussed.

In one embodiment, the first semiconductor wafer 101 comprises a first substrate 102. The first substrate 102 may be formed of group III, group IV, group V elements, and their combinations thereof, such as silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), etc. The first substrate 102 may be doped or un-doped. In one embodiment, the first substrate 102 is a silicon substrate doped with a p-type dopant such as boron (a p-type substrate). In another embodiment, the first substrate 102 is a silicon substrate doped with an n-type dopant such as phosphorous or arsenic (an n-type substrate). The first substrate 102 may be a bulk semiconductor substrate, such as a bulk silicon substrate that is a wafer, a silicon-on-insulator (SOI) substrate, a multi-layered or gradient substrate, hybrid orientation substrates, any combination thereof, and/or the like. The SOI substrate may comprise a layer of a semiconductor material (e.g., silicon, germanium, and/or the like) formed over an insulator layer (e.g., buried oxide and/or the like), which is formed on a silicon substrate.

The first substrate 102 comprises a plurality of pixels 117 and a plurality of isolation structures 119 surrounding each pixel 117. The pixels 117 contain radiation-sensing doped regions. These radiation-sensing doped regions may be formed by one or more ion implantation processes or diffusion processes and are doped with a doping polarity opposite from that of the first substrate 102. In one embodiment, the pixels 117 contain n-type doped regions. For a BSI image sensor device, the pixels 117 may be pixel sensors operable to detect radiation, such as an incident light, that is projected toward the first substrate 102 from the backside 121 (opposite the device side). In some embodiments, the pixels 117 each includes a photodiode. A deep implant region may be formed adjacent each photodiode in some embodiments. The pixels 117 may also be referred to as radiation-detection devices or light-sensors.

The isolation structures 119 may be shallow trench isolation (STI), deep trench isolation (DTI), or a combination thereof. The isolation structures 119 and the subsequently formed metal grids 122 block light from passing between neighboring pixels 117 (FIG. 5) to help reduce cross talk. The isolation structures 119 may include a dielectric material, such as silicon oxide, silicon nitride, silicon oxynitride, a low-k dielectric, or any suitable dielectric material. The pixels 117 and the isolation structures 119 may be formed by forming openings in the first substrate 102 using a drilling process, an etch process, or a combination thereof, filling the openings with the dielectric material, and forming the pixels 117 in the regions between adjacent isolation structures 119. While not shown, the pixels 117 may be varied from one another to have different junction depths, thicknesses, widths, etc. The depth of the pixels 117 is generally less than the combined depth of the isolation structures 119.

The first substrate 102 may further comprise first electrical circuits 103 adjacent the pixels 117 for providing an operation environment for the pixels 117 and for supporting external communication with the pixels 117. In some embodiments, the first electrical circuits 103 may include various n-type metal-oxide semiconductor (NMOS) and/or p-type metal-oxide semiconductor (PMOS) devices, such as transistors, capacitors, resistors, diodes, fuses, a combination thereof, and/or the like. The electrical circuits may be interconnected to perform one or more functions, which may include memory structures, processing structures, sensors, amplifiers, power distribution, input/output circuitry and/or the like. In one exemplary embodiment, the first electrical circuits 103 work with the pixels 117 to function as an array of complementary metal oxide semiconductor (CMOS) image sensors (CISs). One of ordinary skill in the art will appreciate that the above examples are provided for illustrative purposes only and are not intended to limit the various embodiments to any particular applications.

A plurality of first inter-metal dielectric (IMD) layers 104 are formed over the first substrate 102. The first IMD layers 104 may comprise first interconnects 108a, 108b, 108c, 108d (collectively referred to as first interconnects 108). The first IMD layers 104 and first interconnects 108 form a first back-end-of-line (BEOL) structure 113 for the first semiconductor wafer 101. The first interconnects 108 may be in the form of conductive lines/traces. Conductive features 109, such as conductive vias, are selectively provided between adjacent first interconnects 108 to vertically interconnect the first interconnects 108. The first IMD layers 104 and the first interconnects 108 form first metallization layers over the first substrate 102. In various embodiments, the first interconnects 108a are disposed at a first level in the first IMD layers 104 over the first substrate 102, the first interconnects 108b are disposed at a second level over the first level, the first interconnects 108c are disposed at a third level over the second level, and the first interconnects 108d are disposed at a fourth level over the third level. In some embodiments, the first interconnects 108a are disposed in a lower level (e.g., a level being adjacent the first substrate 102) in the first IMD layers 104 and the first interconnects 108d are disposed in a higher level (e.g., a level being away from the first substrate 102) in the first IMD layers 104. In one embodiment, the first interconnects 108d are top metallization layers disposed at the highest level in the first IMD layers 104. In other words, the top metallization layers are first interconnects 108d that are disposed immediately adjacent an interface 111 defined between the first semiconductor wafer 101 and the second semiconductor wafer 201.

In some embodiments, the first interconnects 108a-c disposed at outer region of the first IMD layers 104 may serve as dummy metallization layers for blocking of moisture. The first interconnects 108a-c disposed at inner region of the first IMD layers 104 are those metallization layers underneath the first electrical circuits 103. Generally, metallization layers are used to interconnect the electrical circuitry to each other and to provide an external electrical connection. The first electrical circuits 103 are in electrical connection with the first interconnects 108 (e.g., first interconnects 108a) through respective conductive via 131 that is disposed between and in contact with the first interconnect 108a and a gate 133 of a transistor (e.g., first electrical circuit 103). The second electrical circuits 203 are in electrical connection with the second interconnects 208 (e.g., second interconnects 208a) through respective conductive via 231 that is disposed between and in contact with the second interconnect 208a and a gate 233 of a transistor (e.g., second electrical circuit 203). In some embodiments, the gate 133 (and the gate 233) may be a poly gate, a poly silicide gate, an amorphous gate, an amorphous silicide gate, a vertical transfer gate, doped poly gate, and any types of high-k metal gate. One skilled in the art will appreciate that number of stacked layers and the number/placement of the interconnects within the respective layers as shown in FIG. 1 are provided for illustration only and are not limiting the scope of the present disclosure. Other combinations of metallization layers forming a daisy chain or serial electrical coupling are also contemplated.

The first IMD layers 104 may be formed of, for example, a low-k dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method, such as spin-on coating, chemical vapor deposition (CVD), or plasma-enhanced CVD (PECVD).

The first interconnects 108 may be formed through any suitable formation process (e.g., lithography with etching, damascene, dual damascene, or the like) and may be formed using suitable conductive materials such as copper, aluminum, aluminum alloys, copper alloys or the like. In some embodiments, each of the first interconnects 108 may further comprise a diffusion barrier layer and/or an adhesion layer (not shown) to protect the first IMD layers from metal poisoning. The diffusion barrier layer may comprise one or more layers of TaN, Ta, TiN, Ti, CoW, or the like, and may be deposited by physical vapor deposition (PVD), or the like.

It should be noted that one or more etch stop layers (not shown) may be positioned between adjacent layers of the first IMD layers 104 and the first substrate 102, or between individual layers of the first IMD layers 104. The etch stop layers provide a mechanism to stop an etching process when forming vias and/or contacts. The etch stop layers are formed of a dielectric material having a different etch selectivity from adjacent layers, e.g., the underlying first substrate 102 and the overlying first IMD layers 104. In some embodiments, the etch stop layers may be formed of SiN, SiCN, SiOC, SiON, combinations thereof, or the like, deposited by CVD or PECVD techniques.

The first IMD layers 104 also includes a plurality of storage devices 107 disposed between selected first interconnects 108. Various arrangements of the storage devices 107 are further discussed in FIG. 2A-2D. The storage devices 107 may be any suitable capacitors or memory devices, such as metal-insulator-metal (MIM) capacitors or the like, which provide storage capacity for CMOS image sensors. As will be discussed in more detail below with respect to FIG. 8, a thin film transistor 800 is provided in conjunction with each storage device 107 for processing information received from the storage device 107 and for controlling reading and writing functions of first electrical circuits 103.

FIG. 1 further illustrates a first bonding layer 106 formed over the first IMD layers 104 of the first semiconductor wafer 101, and a second bonding layer 206 formed over the second IMD layers 204 of the second semiconductor wafer 201. The first and second bonding layers 106, 206 form a bonding structure that is subsequently used to bond the first semiconductor wafer 101 and the second semiconductor wafer 201. In some embodiments, the first and second bonding layers 106, 206 may also serve as a passivation layer. The first and second bonding layers 106, 206 may comprise any suitable material for bonding. For example, the first and second bonding layers 106, 206 may be formed of one or more layers comprising silicon oxide, silicon nitride, silicon oxynitride, silicon carbide, silicon oxycarbide, undoped silicon glass, phosphosilicate glass, compounds thereof, composites thereof, combinations thereof, or the like. The first bonding layer 106 may include different material than the second bonding layer 206. In one embodiment, the first bonding layer 106 is silicon oxynitride, and the second bonding layer 206 is silicon oxynitride. The first bonding layer 106 may be deposited by any suitable method, such as spin-on coating, CVD, PECVD, or the like.

In some embodiments, which can be combined with any other embodiment(s) of the present disclosure, the first semiconductor wafer 101 and the second semiconductor wafer 201 may include chips and/or dies formed using a CMOS process, a micro-electro-mechanical systems (MEMS) process, or the like. The first semiconductor wafer 101 and the second semiconductor wafer 201 may be sensor wafers and/or dies such as, for example, a backside illumination sensor (BIS) wafer and/or die, logic wafers and/or dies such as, for example, System-on-Chip (SOC) devices, application-specific integrated circuit (ASIC) devices comprising analog-to-digital converters, data processing circuits, memory circuits, bias circuits, reference circuits, any combinations thereof and/or the like. Other logic dies (e.g., central processing unit, FPGA, microcontroller, etc.) or memory dies (e.g., a DRAM die, a Wide I/O die, a M-RAM die, a R-RAM die, a NAND die, an SRAM die, etc.) may also be used in the first and second semiconductor wafers 101, 201. In one exemplary embodiment, the first semiconductor wafer 101 is a SOC device, and the second semiconductor wafer 201 is an ASIC device.

In one embodiment, the first semiconductor wafer 101 and the second semiconductor wafer 201 are arranged with device sides (also referred to as front sides) of the first substrate 102 and the second substrate 202 facing each other, as shown in FIG. 1. As will be discussed in greater detail below, the first semiconductor wafer 101 and the second semiconductor wafer 201 are bonded and openings are formed extending from the backside 121 of the first semiconductor wafer 101 into the first interconnects 108, the first bonding layer 106, and the second bonding layer 206 to expose the selected second interconnects 208 of the second semiconductor wafer 201. The openings are then filled with a conductive material, thereby forming electrical contacts on the backside of the first semiconductor wafer 101 to electrically interconnect the first semiconductor wafer 101 and the second semiconductor wafer 201. Subsequently, one or more additional semiconductor wafers are bonded to the second semiconductor wafer 201, and additional interconnects are formed to electrically interconnect the one or more additional semiconductor wafers to the first semiconductor wafer 101 and the second semiconductor wafer 201.

Figure 2A:
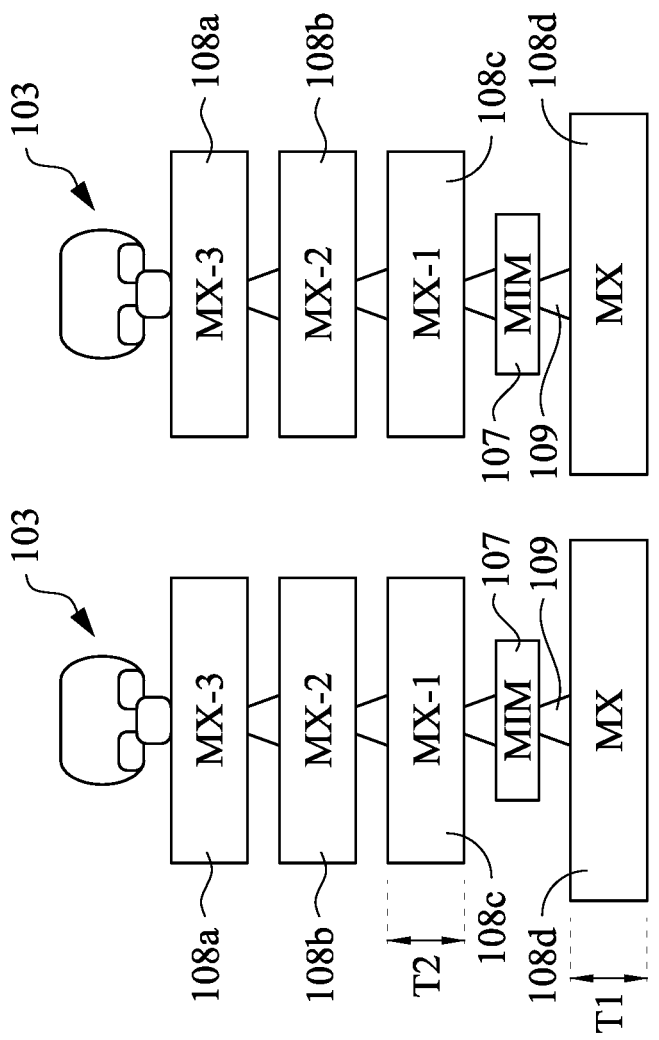
FIGS. 2A-2D illustrate exemplary arrangements of the storage devices in accordance with some embodiments.

FIGS. 2A-2D illustrate exemplary arrangements of the storage devices 107 (e.g., MIM) in accordance with some embodiments. For ease of illustration, only two columns of first interconnects 108a-108d are shown and the first IMD layers 104 have been omitted. It is contemplated that the embodiments shown in FIGS. 2A-2D are equally appliable to various embodiments of the present disclosure, such as those shown in FIGS. 6, 9, 14, and 16. In FIG. 2A, the first interconnects 108, such as the first interconnects 108a, 108b, 108c, 108d, are shown as being arranged in two columns. It is understood that the first interconnects 108a, 108b, 108c, 108d may not be in vertical alignment as shown. Instead, each of the first interconnects 108a-108d may arrange differently between individual layers of the first IMD layers 104, depending on the application. While three rows of first interconnects are shown, more or less first interconnects may be provided and the number of the first interconnects may vary depending on design needs and manufacturing concerns.

The first interconnects 108a, 108b, 108c, 108d are electrically connected through conductive features 109. The first interconnects 108d are disposed at a level that is away from the first electrical circuits 103 and labeled as "Mx". The first interconnects 108c are disposed immediately adjacent the first interconnects 108d and labeled as "Mx-1." The first interconnects 108b are disposed immediately adjacent the first interconnects 108c and labeled as "Mx-2." The first interconnects 108a are disposed between the first interconnects 108b and the first electrical circuits 103 and labeled as "Mx-3." In one embodiment shown in FIG. 2A, the first interconnects 108d ("Mx") are top metallization layers disposed at a highest level in the first IMD layers 104. The storage devices 107 (labeled as "MIM") are disposed in the first and second columns between the first interconnects 108d ("Mx") and the first interconnects 108c ("Mx-1"). The first interconnects 108d ("Mx") may have a thickness T1 and the first interconnects 108c ("Mx-1") may have a thickness T2 that is less than the thickness T1. The first interconnects 108d are formed with greater thickness to allow material consumption during the subsequent etch processes. The storage devices 107 ("MIMs") are provided between the first interconnects 108d ("Mx") and the first interconnects 108c ("Mx-1") for ease of manufacturing.

Figure 2B:
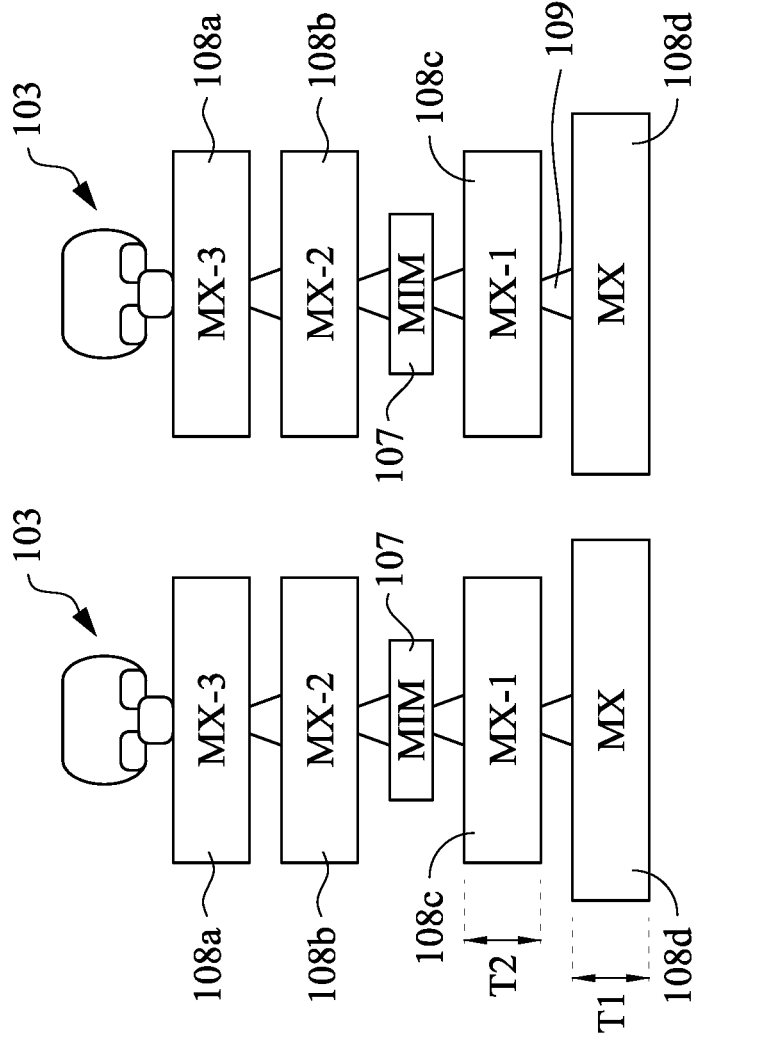

The embodiment shown in FIG. 2B is substantially identical to that of FIG. 2A except that the storage devices 107 are disposed in the first and second columns between the first interconnects 108c ("Mx-1") and the first interconnects 108b ("Mx-2").

Figure 2C:
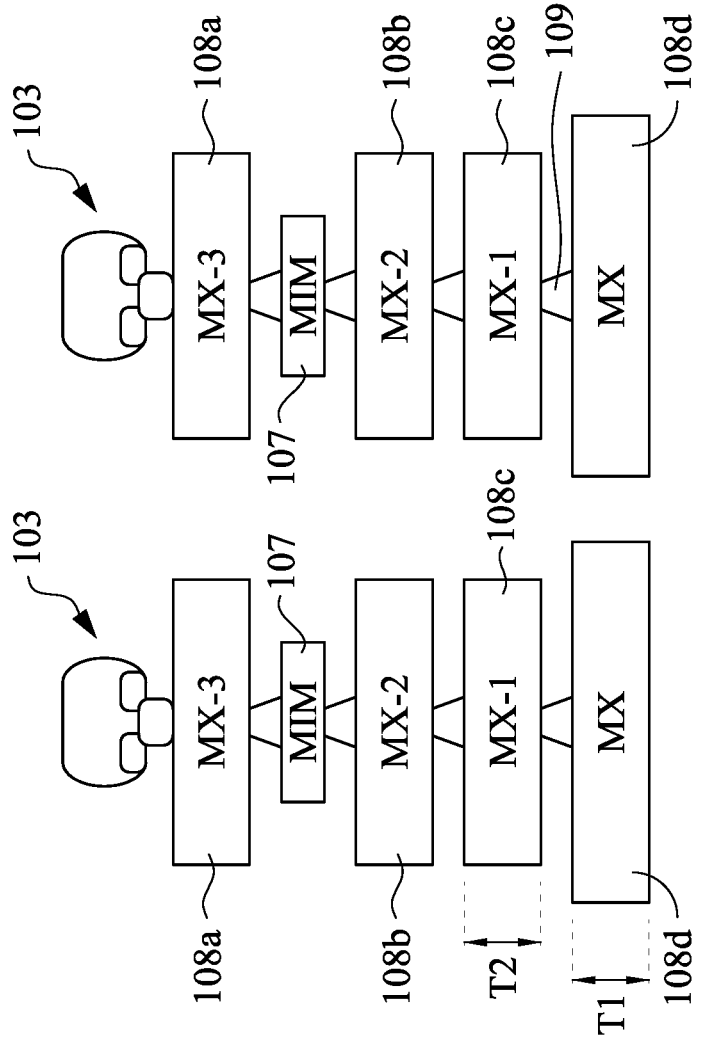

The embodiment shown in FIG. 2C is substantially identical to that of FIG. 2A except that the storage devices 107 are disposed in the first and second columns between the first interconnects 108b ("Mx-2") and the first interconnects 108a ("Mx-3").

Figure 2D:
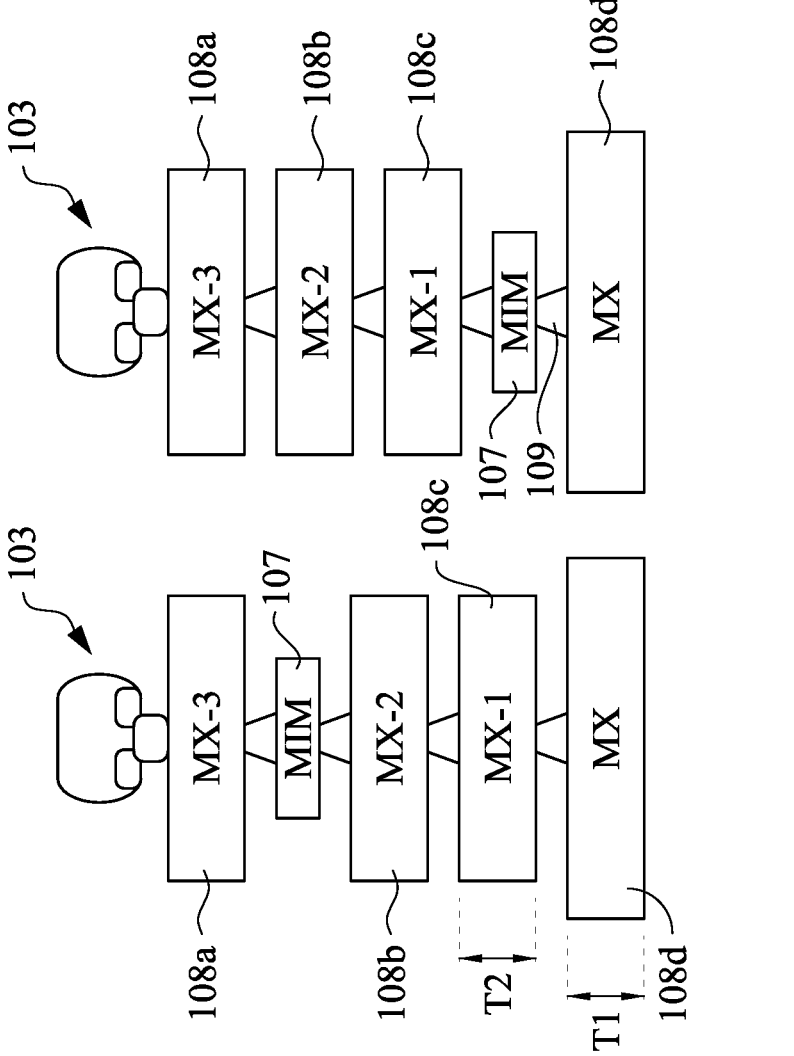

The embodiment shown in FIG. 2D is substantially identical to that of FIG. 2A except that the storage devices 107 in the first column are disposed between the first interconnects 108b ("Mx-2") and the first interconnects 108a ("Mx-3") and the storage devices 107 in the second column are disposed between the first interconnects 108d ("Mx") and the first interconnects 108c ("Mx-1"). It is contemplated that the storage devices 107 in the first column may be disposed between any adjacent first interconnects 108 and the storage devices 107 in the second column may be disposed between any adjacent first interconnects 108.

Figure 3:
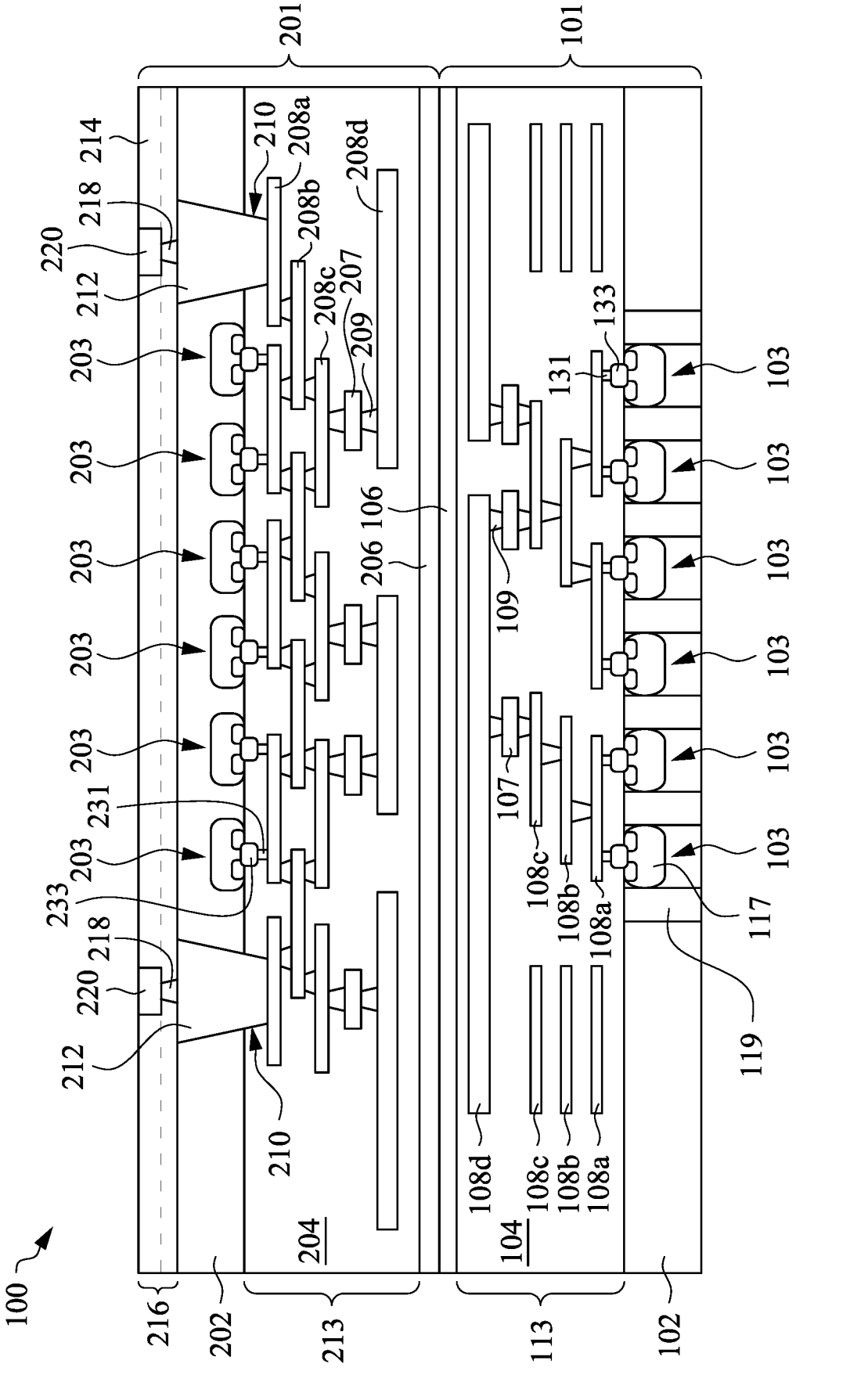

At operation 704, the first semiconductor wafer 101 and the second semiconductor wafer 201 are bonded in accordance with some embodiments, as shown in FIG. 3. The first semiconductor wafer 101 is stacked and bonded on top of the second semiconductor wafer 201. In one embodiment shown in FIG. 3, the first semiconductor wafer 101 and the second semiconductor wafer 201 are bonded using dielectric-to-dielectric bonding (e.g., oxide-to-oxide bonding) by bonding the first bonding layer 106 of the first semiconductor wafer 101 to the second bonding layer 206 of the second semiconductor wafer 201. Additionally or alternatively, the first semiconductor wafer 101 and the second semiconductor wafer 201 may be bonded using, for example, a direct bonding process such as metal-to-metal bonding (e.g., copper-to-copper bonding), metal-to-dielectric bonding (e.g., oxide-to-copper bonding), hybrid boding (e.g., dielectric-to-dielectric and metal-to-metal bonding), any combinations thereof and/or the like.

It should be noted that the bonding may be at wafer-to-wafer level, wherein the first semiconductor wafer 101 and the second semiconductor wafer 201 are bonded together, and are then cut into individual dies. Alternatively, the bonding may be performed at the die-to-die level, or the die-to-wafer level.

After the first semiconductor wafer 101 and the second semiconductor wafer 201 are bonded, the structure of the first and second semiconductor wafer 101, 201 is flipped over so that the backside of the second semiconductor wafer

201 is facing up. A thinning process may be applied to the backside of the second semiconductor wafer 201 (and/or the first semiconductor wafer 101 in some embodiments). The thinning process may be implemented by using any suitable techniques such as grinding, polishing, and/or chemical etching. For example, a substantial amount of substrate material may be first removed from the backside of the second substrate 202 using a mechanical grinding process. Then, a chemical thinning process may apply an etching chemical to further thin the backside of the second substrate 202. In some embodiments, the thickness of the second substrate 202 after thinning process is less than about 10 μm, for example about 1 μm to about 5 μm.

After the thinning process, openings 210 are formed on the backside of the second semiconductor wafer 201. The openings 210 extend through the second substrate 202 and into the second IMD layers 204 of the second semiconductor wafer 201 to expose a portion of selected second interconnects 208, such as the second interconnects 208a disposed at an outer region of the second IMD layers 204. The openings 210 may be formed by a photolithography process and one or more etch processes, such as a dry etch (e.g., reactive ion etch (RIE)), an anisotropic wet etch, laser drilling, or a combination thereof. Conductive material, such as copper, tungsten, titanium, aluminum, or the like, any combination thereof, is then formed within the openings 210 to form second through hole structures 212 using an electro-chemical plating process. The second through hole structures 212 may be through-silicon-via (TSV), through-oxide-via (TOV), through-insulator-via (TIV), or big through-silicon-via (BTSV). In one embodiment, the second through hole structures 212 are BTSV. The second through hole structures 212 may be formed to have a trapezoidal shape, a rectangular shape, or any suitable shape. The excess conductive materials may be removed using a planarization process (e.g., a CMP process), or the like, using the second substrate 202 as a stop layer. While not shown, one or more barrier layers (e.g., TaN or the like) may be formed along the sidewalls of the openings 210 to prevent the subsequent conductive material from diffusing into the neighboring layers.

After the second through hole structures 212 are formed, a first redistribution layer (RDL) 214 is formed over the backside of the second semiconductor wafer 201 in accordance with some embodiments. The first RDL 214 comprises one or more dielectric layers 216 with conductive elements 220 disposed within the one or more dielectric layers 216. The one or more dielectric layers 216 may be formed using similar materials and method as the first and second bonding layers 106, 206. The conductive elements 220 may be conductive lines/traces that are electrically coupled to the second through hole structures 212 through conductive elements 218, which may be conductive vias. The conductive elements 218, 220 may be formed using similar materials and methods as the first interconnects 108 and the conductive features 109. As will be discussed in greater detail below, the first RDL 214 and a second RDL 314 of a subsequent third semiconductor wafer 301 (FIG. 4) are to be bonded together through an insulator-to-insulator (e.g., dielectric layers 216 to dielectric layers 316) and a metal-to-metal (e.g., conductive elements 220 to conductive elements 320) hybrid bonding technology, allowing for power and electrical/photodiode signals from the first through hole structures 112 of the first semiconductor wafer 101 to be distributed to various elements in the second and third semiconductor wafers 201, 301.

Figure 4:
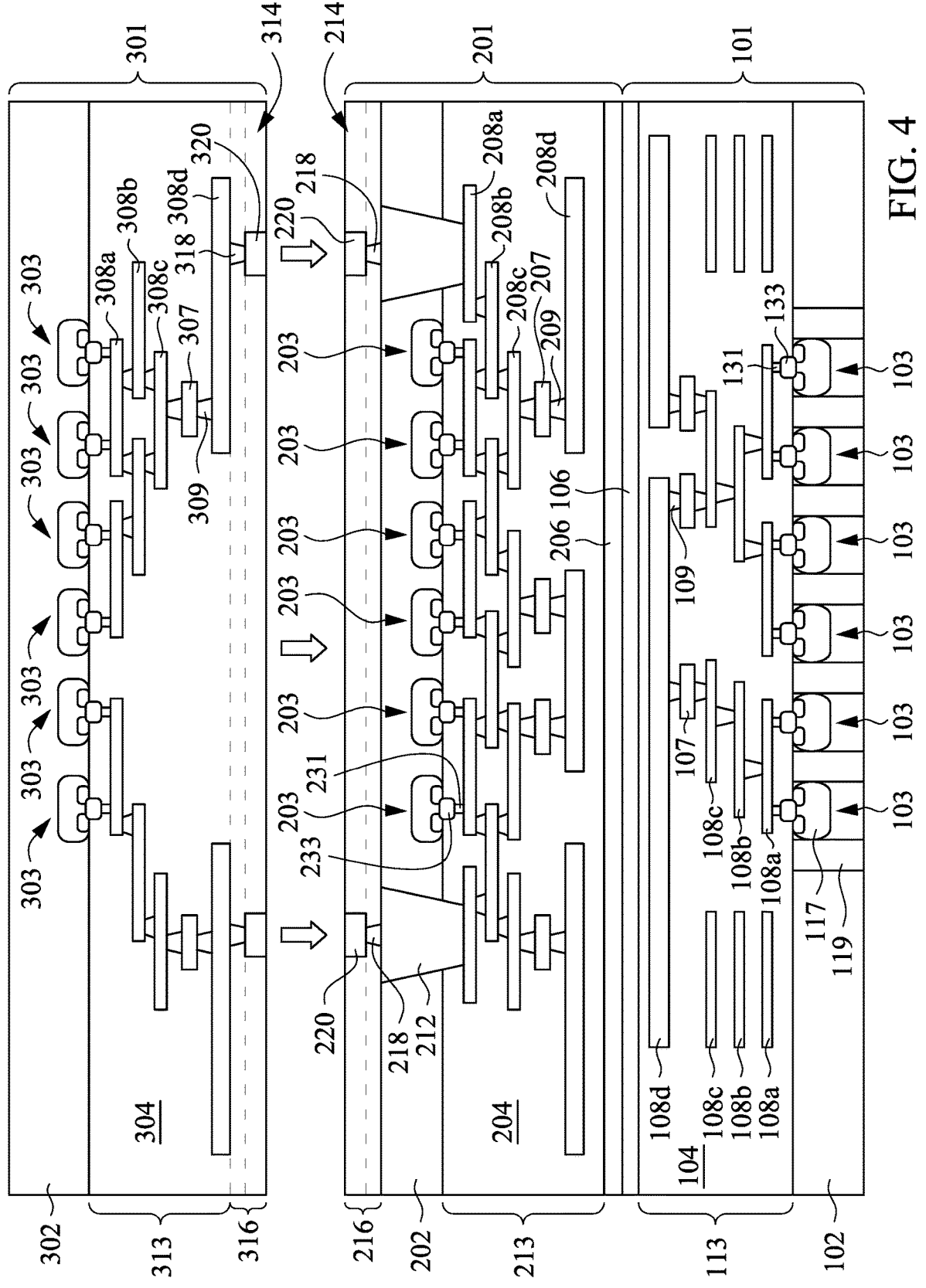
Figure 5:
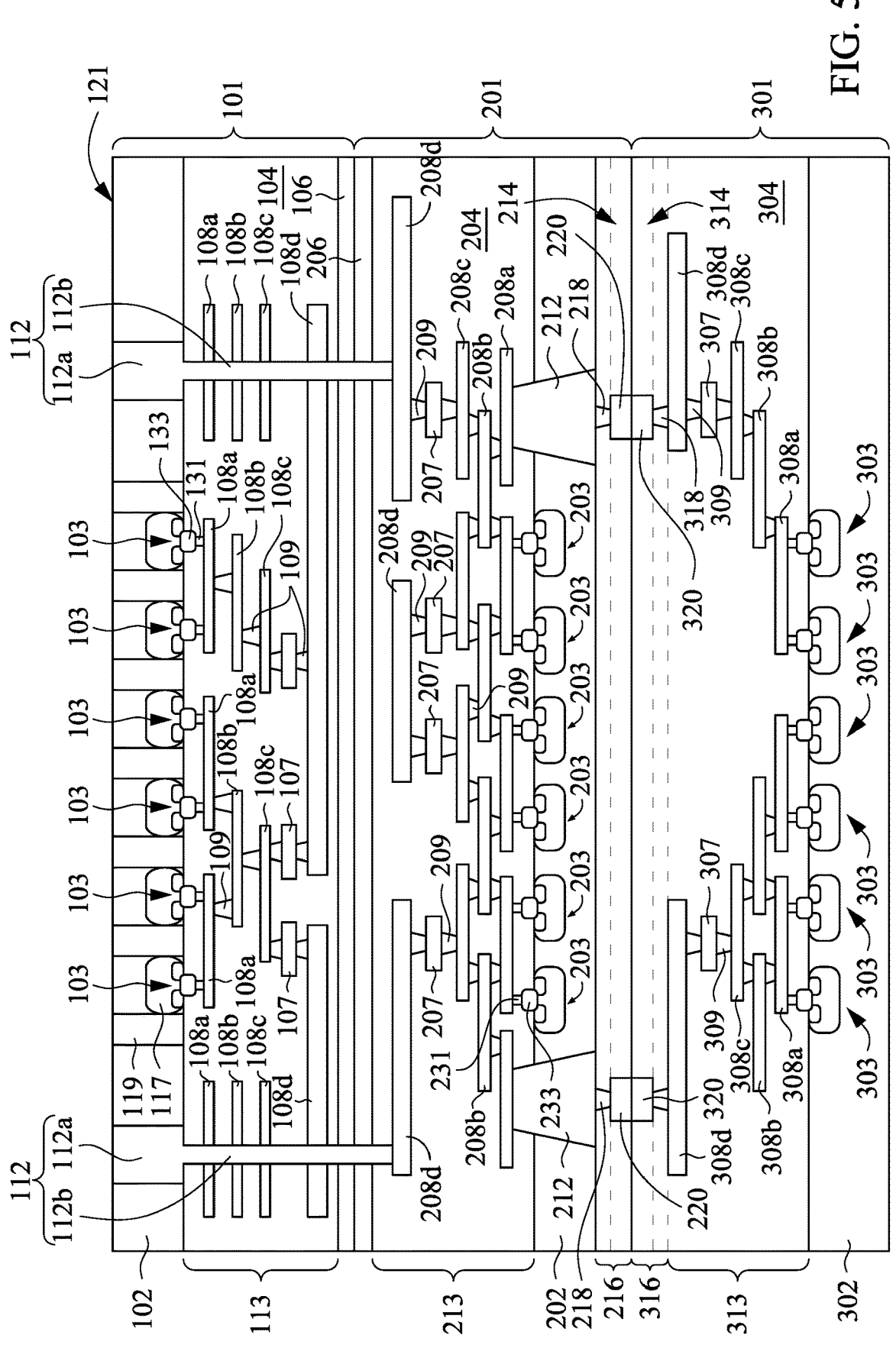

At operation 706, a third semiconductor wafer 301 is formed and bonded to the second semiconductor wafer 201. FIG. 4 illustrate a manufacturing stage of the first, second, and third semiconductor wafers 101, 201, 301 prior to a bonding process in accordance with various embodiments. The third semiconductor wafer 301 has similar features as the first and second semiconductor wafers 101, 201, and for the purpose of the following discussion, the features of the third semiconductor wafer 301 having reference numerals of the form "3xx" are similar to features of the first and second semiconductor wafers 101, 201 having reference numerals of the form "1xx" and "2xx." Various elements of the third semiconductor wafer 301 will be referred to as the "third <element>3xx." It is understood that while the third semiconductor wafer 301 is shown to be bonded to the second semiconductor wafer 201, the third semiconductor wafer 301 may also be bonded to the backside of the first semiconductor wafer 101.

In FIG. 4, the third semiconductor wafer 301 and the structure of FIG. 3 are arranged with a front side of a third substrate 302 facing the backside of the second substrate 202. The third semiconductor wafer 301 may be bonded to the second semiconductor wafer 201 using a hybrid bonding technology, e.g., by bonding a second RDL 314 (having features similar to the first RDL 214) of the third semiconductor wafer 301 to the first RDL 214 of the second semiconductor wafer 201. In such cases, conductive elements 320 are directly bonded to the conductive elements 220, and a topmost dielectric layer of the one or more dielectric layers 316 of the third semiconductor wafer 301 is directly bonded to a topmost dielectric layer of the one or more dielectric layers 216 of the second semiconductor wafer 201. The first RDL 214 and the second RDL 314 thus form a hybrid bonding structure.

Likewise, the third semiconductor wafer 301 has storage devices 307, which may be MIM capacitors. The storage devices 307 may be arranged between the third interconnects 308d and the third interconnects 308c. Alternatively, the storage devices 307 may be arranged in accordance with various embodiments discussed above with respect to FIGS. 2A-2D. The third semiconductor wafer 301 may be wafer and/or die formed using a CMOS process, a MEMS process, or the like. The third semiconductor wafer 301 may be logic wafers and/or dies such as, for example, SOC devices, ASIC devices comprising analog-to-digital converters, data processing circuits, memory circuits, bias circuits, reference circuits, any combinations thereof and/or the like. Other logic dies (e.g., central processing unit, FPGA, microcontroller, etc.) or memory dies (e.g., a DRAM die, a Wide I/O die, a M-RAM die, a R-RAM die, a NAND die, an SRAM die, etc.) may also be used in the third semiconductor wafer 301. In one exemplary embodiment, the third semiconductor wafer 301 is an ASIC device.

In some embodiments, the total number of the storage devices 207 in the second BEOL structure 213 is greater than the storage devices 107, 207 in the first and third BEOL structures 113, 313. The arrangement of the storage devices in the first, second, and third semiconductor wafers 101, 201, 301 may be different from one another. In some embodiments, the storage devices 107 in the first semiconductor wafer 101 may be arranged in accordance with the embodiment shown in FIG. 2B or 2C, the storage devices 207 in the second semiconductor wafer 201 may be arranged in accordance with the embodiment shown in FIG. 2A, and storage devices 307 in the third semiconductor wafer 301 may be arranged in accordance with the embodiment shown in FIG. 2B or 2C. In some embodiments, the storage devices

107 in the first semiconductor wafer 101 may be arranged in accordance with the embodiment shown in FIG. 2B or 2D, the storage devices 207 in the second semiconductor wafer 201 may be arranged in accordance with the embodiment shown in FIG. 2A, and storage devices 307 in the third semiconductor wafer 301 may be arranged in accordance with the embodiment shown in FIG. 2B or 2D.

At operation 708, after the third semiconductor wafer 301 is bonded to the second semiconductor wafer 201, the structure of FIG. 4 is flipped over so that the backside of the first semiconductor wafer 101 is facing up. Then, first through hole structures 112 are formed in the first semiconductor wafer 101. The first through hole structures 112 may each comprise two portions, in which a first portion 112a of the first through hole structure 112 extends from the backside of the first substrate 102 into a front side of the first substrate 102, and a second portion 112b of the first through hole structure 112 extends from the front side of the first substrate 102 into the first IMD layers 104, the first interconnects 108a-108d, the first and second bonding layers 106, 206, and the second IMD layers 204 and land on selected second interconnects 208d. The first portion 112a may be disposed at regions outside the pixels 117. In some embodiments, the first portion 112a of the first through hole structures 112 extends from the backside of the first substrate 102 into the first IMD layers 104. In such cases, the first portion 112a of the first through hole structures 112 may extend to a region between the first interconnects 108c and the first interconnects 108d, and the second portion 112b may extend from between the first interconnects 108c and the first interconnects 108d, through the first and second bonding layers 106, 206 and the second IMD layers 204, and land on the selected second interconnects 208d. In either case, the first portion 112a of the first through hole structures 112 may have a width W1 and the second portion 112b of the first through hole structures 112 may have a width W2 that is less than the width W1. The first through hole structures 112 may be TSV, TOV, TIV, or BTSV. In one embodiment, the second through hole structures 112 are TOV. The first through hole structures 112 are in electrical communication with the first and second electrical circuits 103, 203 through the first and second interconnects 108, 208, respectively. The first through hole structures 112, the second through hole structures 212, and conductive elements 220, 320 therefore ensure an electric current passing through the first through hole structures 112 to be distributed to various elements between the first, second, and third semiconductor wafers 101, 201, 301.

The first through hole structures 112 may include the same conductive material as the second through hole structures 212 and be formed using the same process as the second through hole structures 212. The excess conductive materials may be removed by a planarization process using the first substrate 102 as a stop layer. While not shown, one or more barrier layers (e.g., TaN or the like) may be formed prior to the formation of the first through hole structures 112 to prevent the conductive material from diffusing into the neighboring layers.

At operation 710, after the formation of the first through hole structures 112, a high-k material 120 is formed on the backside 121 of the first semiconductor wafer 101. The high-k material 120 may be used as an anti-reflective coating (ARC) to enhance the performance. The high-k material 120 may be an oxide-based material such as $SiO_2$, $Al_2O_3$, $Ta_2O_5$, or the like, and may be formed using any suitable deposition technique such as PVD, ALD, CVD, etc. Then, a plurality of metal grids 122 are disposed in a dielectric layer 126 formed over the high-k material 120. The metal grids 122 and the isolation structures 119 block light from passing between neighboring pixels 117 to help reduce cross talk. The metal grids 122 may be formed of tungsten, copper, aluminum copper, or the like.

Color filters 128 and micro-lenses 130 are formed over the dielectric layer 126 and between the gaps of the metal grids 122. The color filters 128 are positioned such that the incident radiation is directed thereon and therethrough. The color filters 128 may include a dye-based or pigment-based polymer for filtering a specific wavelength band of the incident radiation. The micro-lenses 130 are formed over the color filters 128 and configured to direct and focus the incident radiation toward specific radiation-sensing regions in the first substrate 102, such as pixels 117. The micro-lenses 130 may have various shapes depending on a refractive index of a material used for the micro-lenses 130 and distance from a sensor surface.

Figure 8:
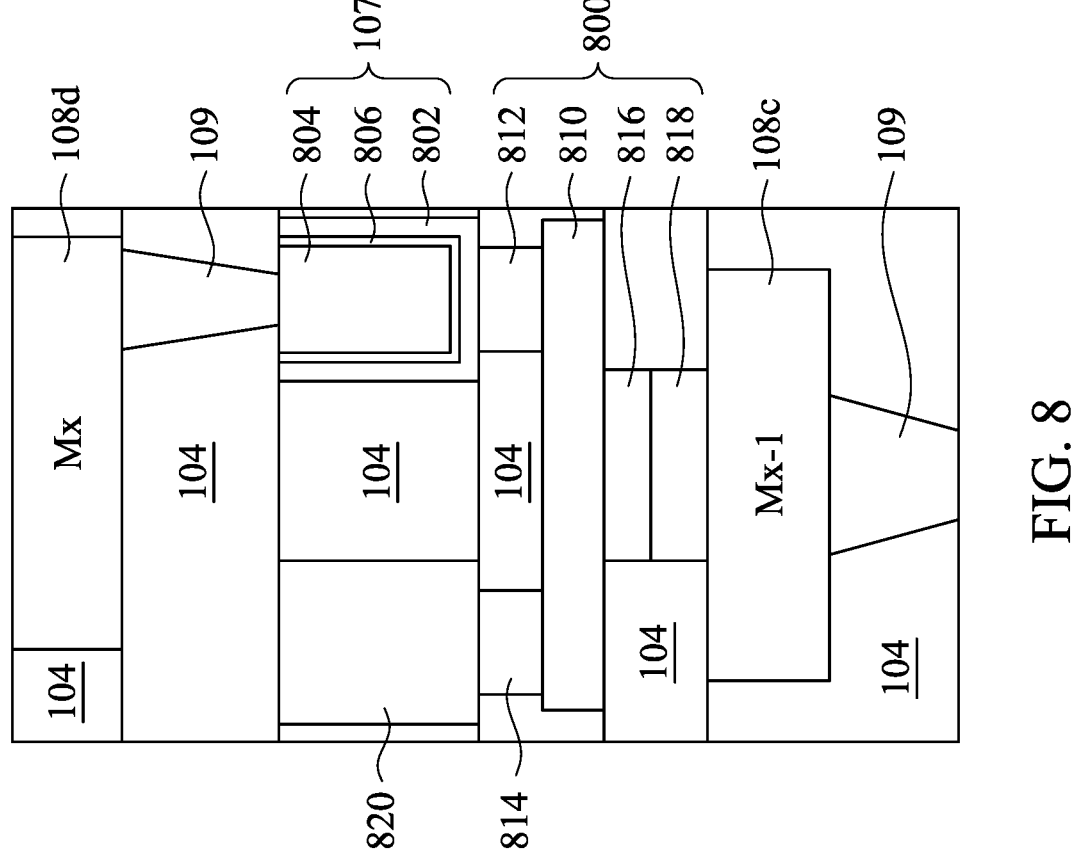
FIG. 8 illustrates a portion of the first IMD layers in which the storage device is connected to a thin film transistor in accordance with some embodiments.

FIG. 8 illustrates a portion of the first IMD layers 104 in which the storage device 107 is connected to a thin film transistor 800 in accordance with some embodiments. It should be understood that embodiments shown in FIG. 8 can be used in conjunction with the storage devices 107 shown in FIGS. 1-6 and various embodiments of the storage devices discussed in this disclosure. The storage device 107 is embedded in the first IMD layer 104 between the top metallization layers (Mx), e.g., the first interconnects 108*d* and the metallization layer (Mx-1), e.g., the first interconnects 108*c* disposed immediately adjacent the first interconnects 108*d*. The storage device 107 may be a MIM structure or any suitable memory element. In the embodiment shown in FIG. 8, the storage device 107 is a MIM structure comprising a bottom electrode 802, a top electrode 804, and a dielectric layer 806 sandwiched in between the bottom and top electrodes 802, 804. The MIM structure can be used to hold a charge indicating a value of one or zero. The storage device 107 may be a dual-damascene type MIM structure as shown. Other types, such as a planar-type, a cylinder-type, a cup-type, or a bar-type MIM structure, which each includes a top and a bottom electrode on either side of a dielectric layer, may also be used. Each of the storage devices 107 in the first, second, and third semiconductor wafers 101, 201, 301 may include the same type of MIM structure. In some embodiments, any of the storage devices 107 in the first, second, and third semiconductor wafers 101, 201, 301 may include any combination of these types of MIM structures.

The thin film transistor 800 may comprise a channel 810, source/drain (S/D) nodes 812, 814 disposed on a first side of the channel 810, a gate dielectric 816 disposed on a second side of the channel 810 opposing the S/D nodes 812, 814, and a gate node 818 disposed on the gate dielectric 816. The channel 810 may include metal oxides, such as Indium-Gallium-Zinc-Oxide (InGaZnO), InGaZnO doped with Zr, Al, Sn, or combination thereof, InGaO, $SnO_2$, $NiO_x$, $NiO_x$ doped with Sn, or the like. Alternatively, amorphous silicon, polysilicon, poly-germanium, or a polycrystalline composition of III-V elements that is doped with n-type or p-type dopants, may also be used as a material for the channel 810. The S/D nodes 812, 814 may include titanium nitride, tantalum nitride, or the like. The gate dielectric 816 may include hafnium oxide, zirconium oxide, aluminum oxide, silicon oxide, or the like. The gate node 818 is disposed between the gate dielectric 816 and the first interconnect 108*c* (Mx-1) disposed immediately adjacent the first interconnect 108*d* (i.e., top metallization layer (Mx)). The S/D node, for example S/D node 812, may serve as a source node, and the S/D node 814 may serve as a drain node. The S/D node 812 may be disposed in one of the first IMD layers 104 between the bottom electrode 802 and the channel 810. The S/D node 812 connects the channel 810 to the bottom electrode 802 of the storage device 107. The S/D node 814 may be disposed in one of the first IMD layers 104 between a bit line 820 and the channel 810. The S/D node 814 connects the bit line 820 to the channel 810, allowing the bit line 820 to communicate with the first electrical circuits 103 and pixels 117 through the first interconnects 108 and the conductive features 109.

Figure 6:
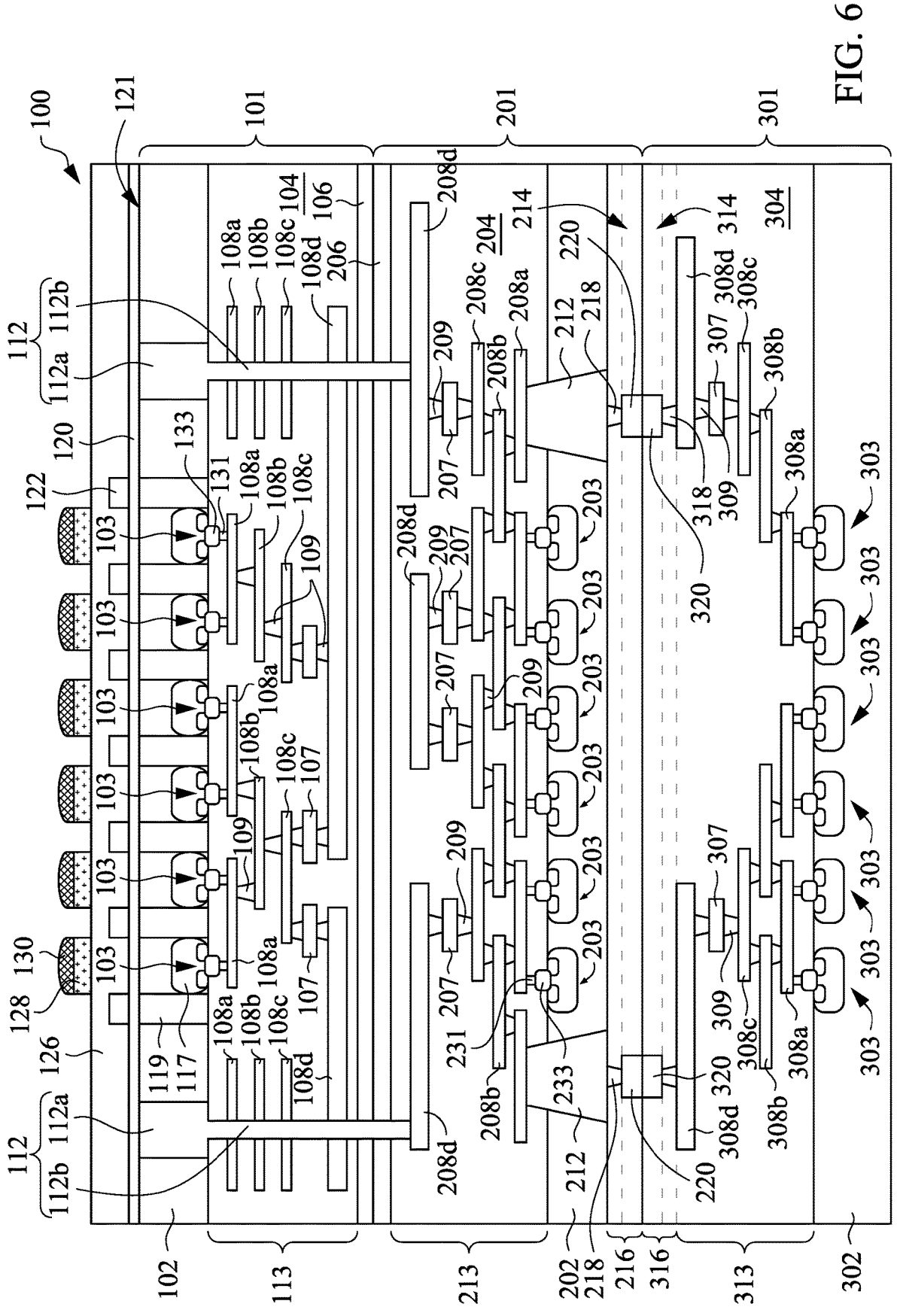
Figure 9:
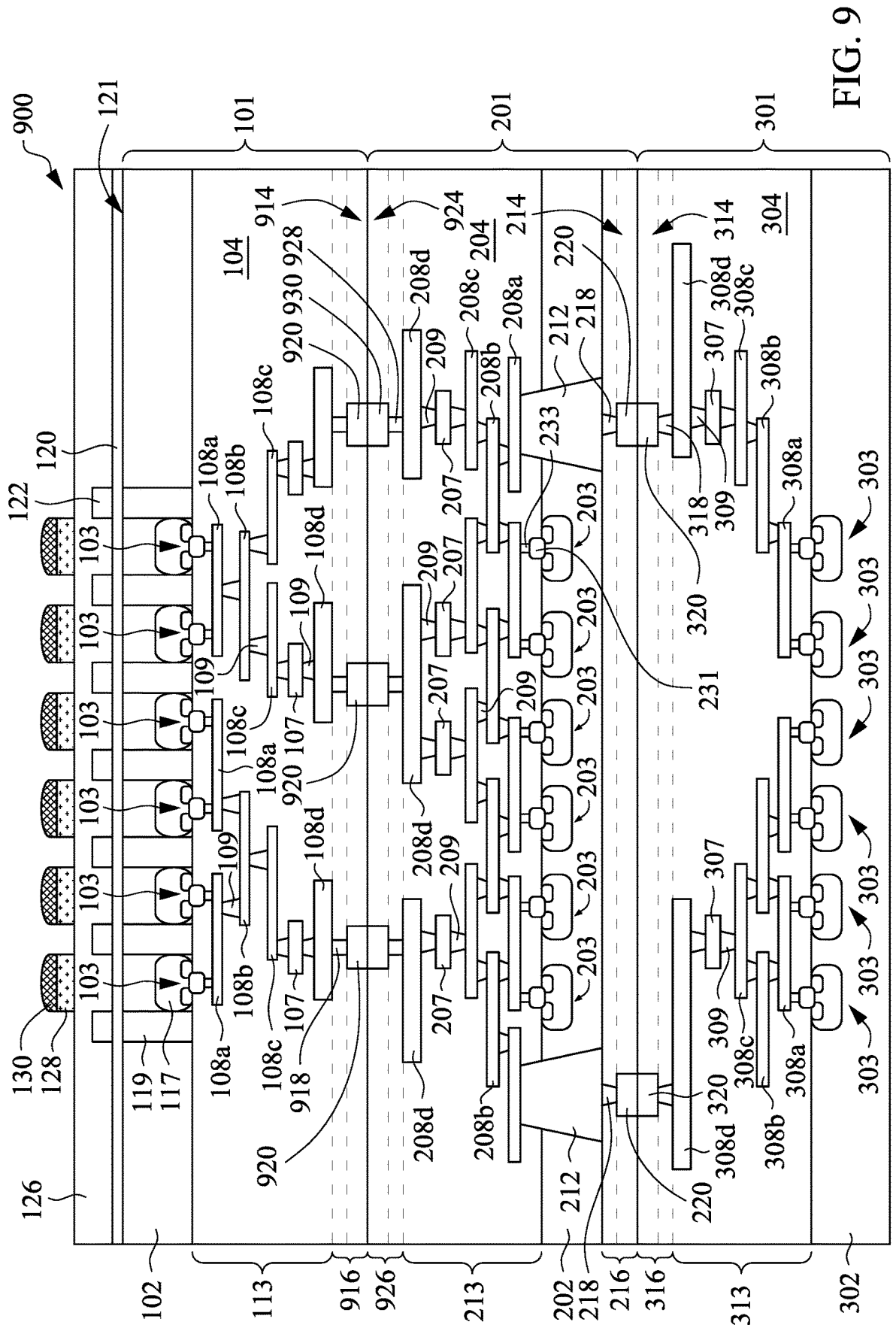
FIG. 9 is cross-sectional view of a semiconductor device in accordance with some embodiments of the present disclosure.

FIG. 9 is cross-sectional view of a semiconductor device 900 in accordance with some embodiments of the present disclosure. The embodiment shown in FIG. 9 is substantially identical to the embodiment shown in FIG. 6 except that the first semiconductor wafer 101 and the second semiconductor wafer 201 are bonded together through a hybrid bonding technology, instead of bonding through the first bonding layer 106 and the second bonding layer 206 as shown in FIG. 6. In this embodiment, a third RDL 914 is formed over the first BEOL structure 113 of the first semiconductor wafer 101, and a fourth RDL 924 is formed over the second BEOL structure 213 of the second semiconductor wafer 201. The third RDL 914 comprises one or more dielectric layers 916 with conductive elements 918, 920 disposed within the one or more dielectric layers 916, and the fourth RDL 924 comprises one or more dielectric layers 926 with conductive elements 928, 930 disposed within the one or more dielectric layers 926. Likewise, the first semiconductor wafer 101 and the second semiconductor wafer 201 are bonded together by directly bonding conductive elements 920 to the conductive elements 930, and directly bonding a topmost dielectric layer of the one or more dielectric layers 916 to a topmost dielectric layer of the one or more dielectric layers 926. The third RDL 914 and the fourth RDL 924 thus form a hybrid bonding structure. In some embodiments, the first semiconductor wafer 101 may be a SOC wafer comprising semiconductor image sensors, the second semiconductor wafer 201 may be a first ASIC wafer comprising a first logic circuit, and the third semiconductor wafer 301 may be a second ASIC wafer comprising a second logic circuit. This embodiment can be combined with any one or more embodiments of the present disclosure.

FIGS. 10-14 are cross-sectional views of various processing steps of manufacturing a semiconductor device 1000 (FIG. 14) according to embodiments of the present disclosure. FIG. 15 is a flow diagram illustrating a method 1500 of manufacturing the semiconductor device 1000 in accordance with some embodiments of the present disclosure. The semiconductor device 1000 may serve as an image sensor device, such as a BSI image sensor device. It is understood that additional operations can be provided before, during, and after the method shown in FIG. 15, and some of the operations described below can be replaced or eliminated, for additional embodiments of the method. The order of the operations/processes is not limiting and may be interchangeable.

Figure 10:
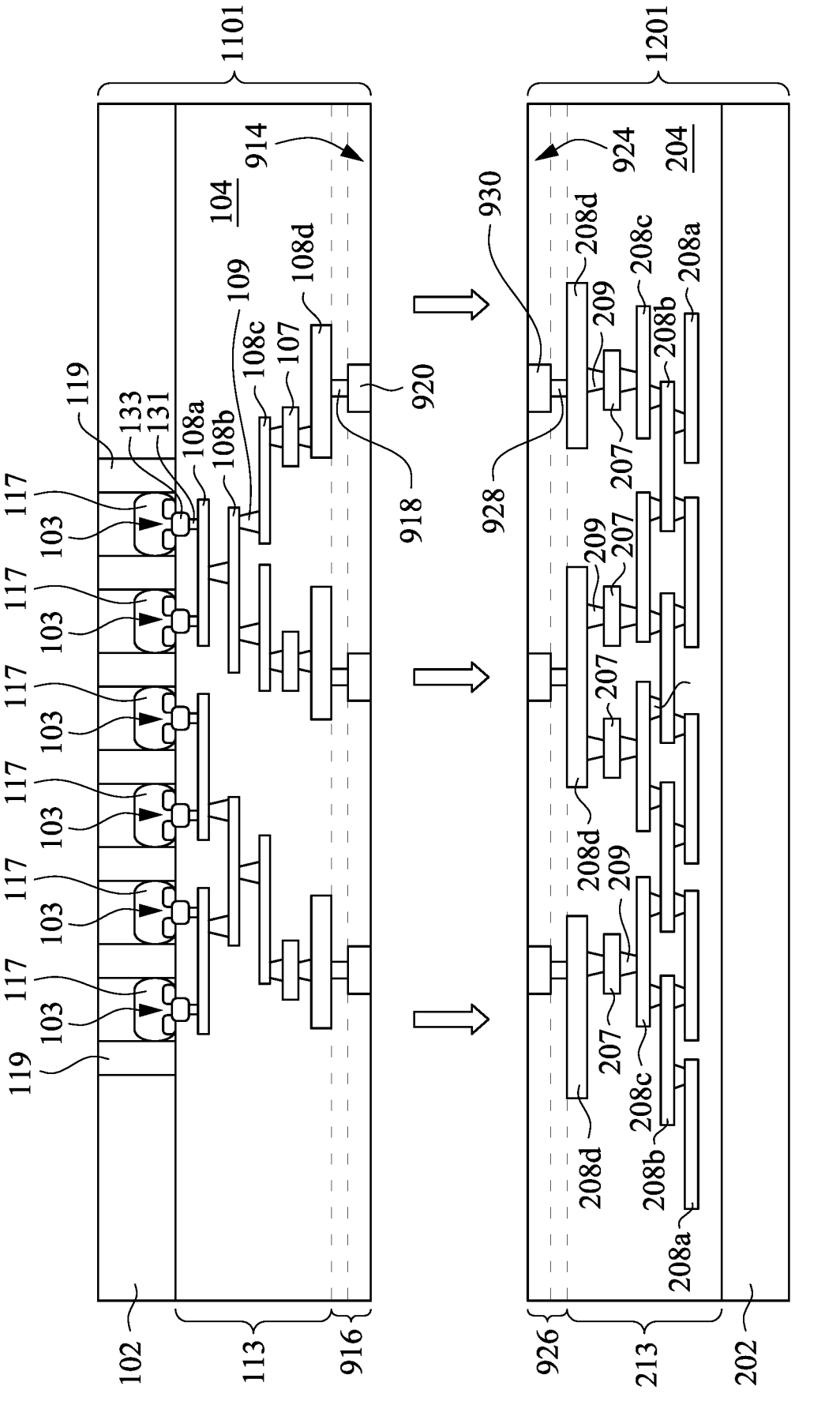
FIGS. 10-14 are cross-sectional views of various processing steps of manufacturing a semiconductor device according to embodiments of the present disclosure.

At operation 1502, a first semiconductor wafer 1101 and a second semiconductor wafer 1201 are provided. FIG. 10 shows a manufacturing stage of the first semiconductor wafer 1101 and the second semiconductor wafer 1201 prior to a bonding process in accordance with various embodiments. The first and second semiconductor wafers 1101, 1201 have features similar to the first and second semiconductor wafers 101, 201 shown in FIG. 9 except that the second semiconductor wafer 1201 is provided without the electrical circuits 203 forming in the second substrate 202.

Figure 11:
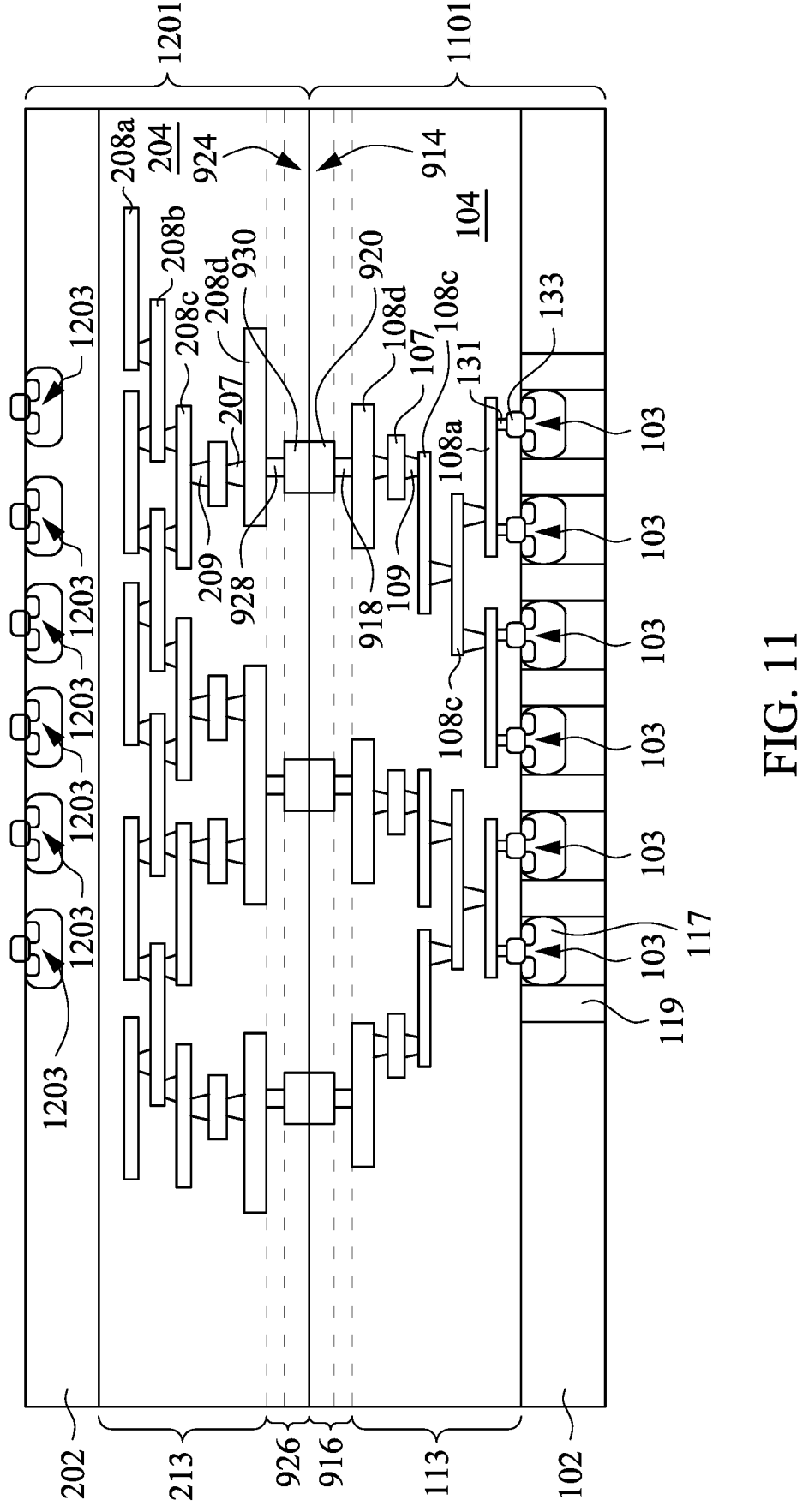

At operation 1504, the first semiconductor wafer 1101 and the second semiconductor wafer 1201 are bonded together through a hybrid bonding technology. In one embodiment, the hybrid bonding is performed by bonding the conductive elements 920 of the first semiconductor wafer 1101 directly to the conductive elements 930 of the second semiconductor wafer 1201, and a topmost dielectric layer of the one or more dielectric layers 916 directly to a topmost dielectric layer of the one or more dielectric layers 926. The structure of the first semiconductor wafer 1101 and the second semiconductor wafer 1201 is then flipped over so that the backside of the second substrate 202 is facing up, as shown in FIG. 11. Then, electrical circuits 1203, such as the electrical circuits 203, are formed in the second substrate 202 using a CMOS process, for example.

Figure 12:
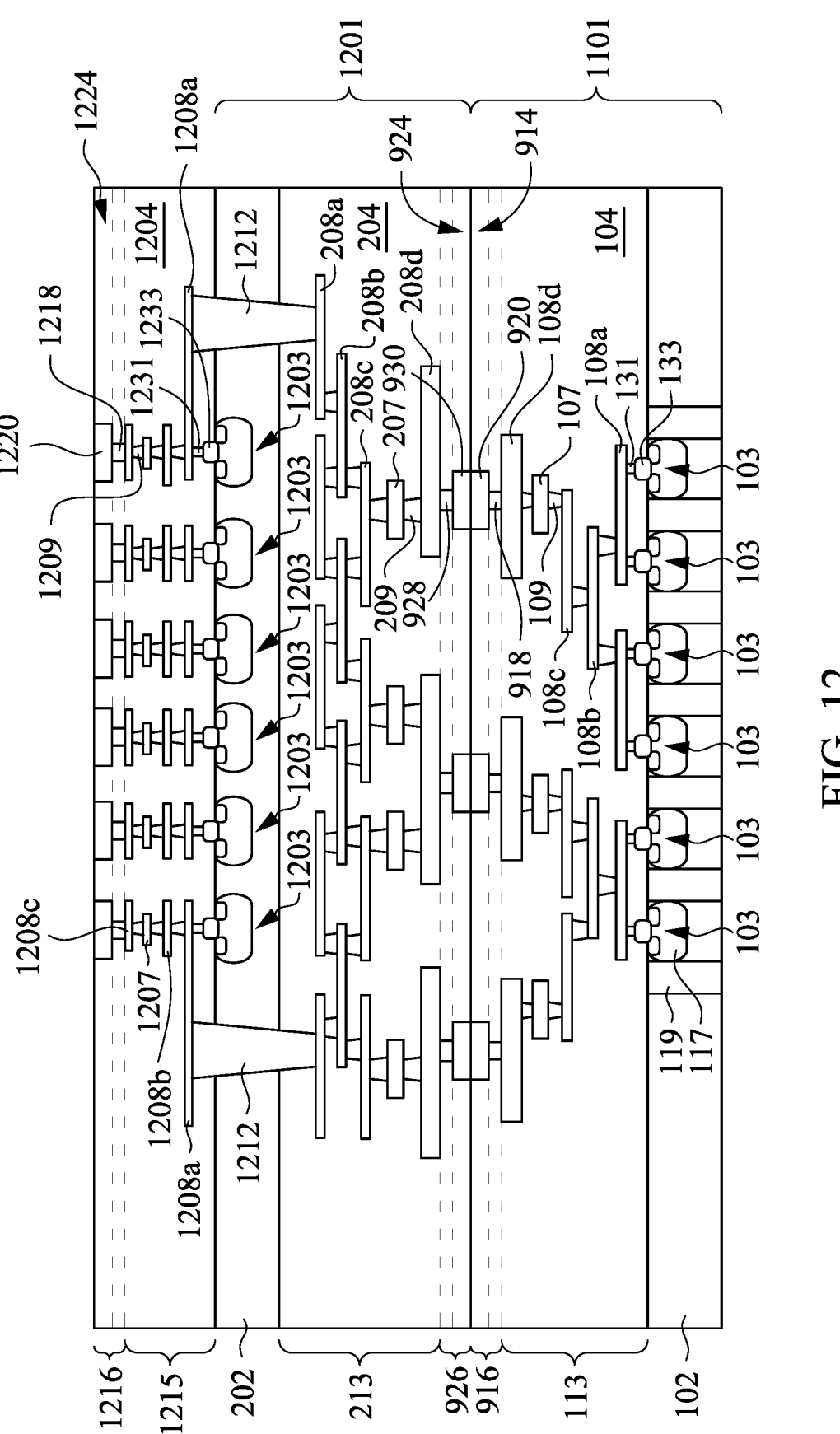

At operation 1506, a backside BEOL structure 1215 and an RDL 1224 are formed over the backside of the second substrate 202, as shown in FIG. 12. Similar to the first BEOL structure 113, the backside BEOL structure 1215 comprises a plurality of IMD layers 1204 and interconnects 1208a, 1208b (collectively referred to as interconnects 1208) formed in the IMD layers 1204. The interconnects 1208 may be in the form of conductive lines/traces. Conductive features 1209, such as conductive vias, are provided between interconnects 1208 to vertically interconnect the interconnects 1208. The interconnects 1208a are disposed at a level adjacent the second substrate 202 in the IMD layers 1204 and the interconnects 1208c (e.g., top metallization layers) are disposed at a level away from the second substrate 202 in the IMD layers 1204. The electrical circuits 1203 are in electrical connection with the interconnects 1208 (e.g., interconnects 1208a) through respective conductive via 1231 that is disposed between and in contact with the interconnect 1208a and a gate 1233 of a transistor (e.g., electrical circuit 1203). In some embodiments, the gate 1233 may be a poly gate, a poly silicide gate, an amorphous gate, an amorphous silicide gate, a vertical transfer gate, doped poly gate, and any types of high-k metal gate. While three rows of interconnects are shown, more or less interconnects are contemplated depending on the application.

Similar to the first and second BEOL structures 113, 213, the backside BEOL structure 1215 of the second semiconductor wafer 1201 comprises a plurality of storage devices 1207 disposed between the interconnects 1208b and interconnects 1208c. The storage devices 1207 may be any suitable capacitors, such as the storage devices 107. The storage devices 1207 may be arranged in accordance with the embodiments shown in FIGS. 2A-2D. Likewise, each storage device 1207 is electrically coupled to a thin film transistor, such as the thin film transistor 800 shown in FIG. 8. Since each storage device 1207 has its own control node transistor and are provided in the backside BEOL structure 1215 and the second BEOL structure 213 on both sides of the second substrate 202, high speed frame rate storage and faster management of photodiode signals for image processing can be achieved.

Through hole structures 1212, such as through hole structures 212, are formed to electrically connect the selected interconnects 1208 to the selected interconnects 208. As a result, the second semiconductor wafer 1201 and the third semiconductor wafer 1301 are interconnected. In some embodiments, the through hole structures 1212 are arranged to extend through a portion of the backside BEOL structure 1215, the second substrate 202, and into the second BEOL structure 213, thereby connecting the interconnects 1208a disposed at outer region of the backside BEOL structure 1215 to the second interconnects 208a disposed at outer region of the second BEOL structure 213. The through hole structures may be TSV, TOV, or BTSV. In some embodiments, the through hole structures 1212 is BTSV. The RDL 1224 is formed over the backside BEOL structure 1215. The RDL 1224 comprises one or more dielectric layers 1216 with conductive elements 1218, 1220 disposed within the one or more dielectric layers 1216.

Figure 13:
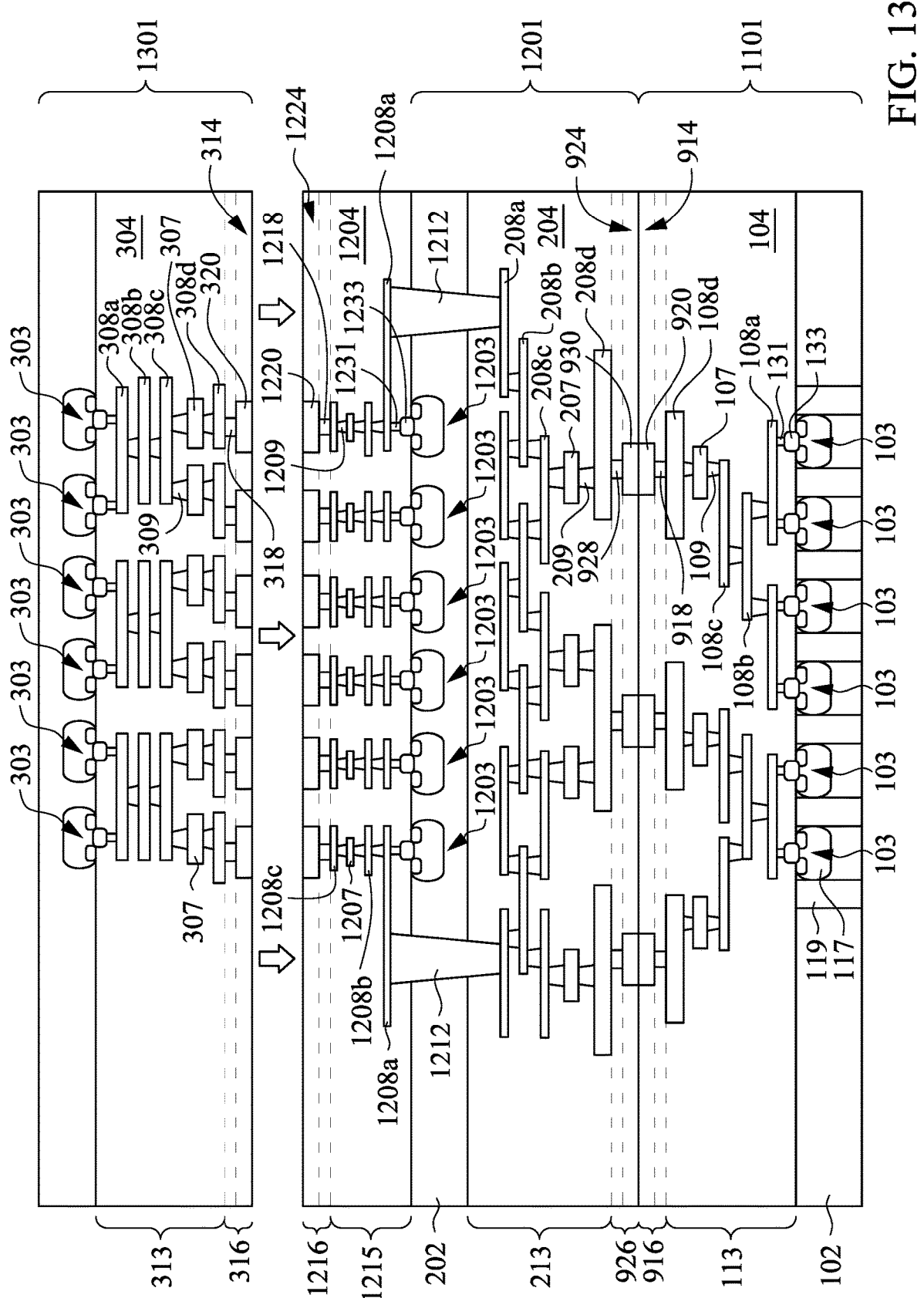

At operation 1508, a third semiconductor wafer 1301, such as the third semiconductor wafer 301, is bonded to the second semiconductor wafer 1201, as shown in FIG. 13. In some embodiments, the second and third semiconductor wafers 1201, 1301 are bonded together through a hybrid bonding technology, e.g., by directly bonding the second RDL 314 of the third semiconductor wafer 301 to the RDL 1224. The second RDL 314 and the RDL 1224 thus form a hybrid bonding structure.

Figure 14:
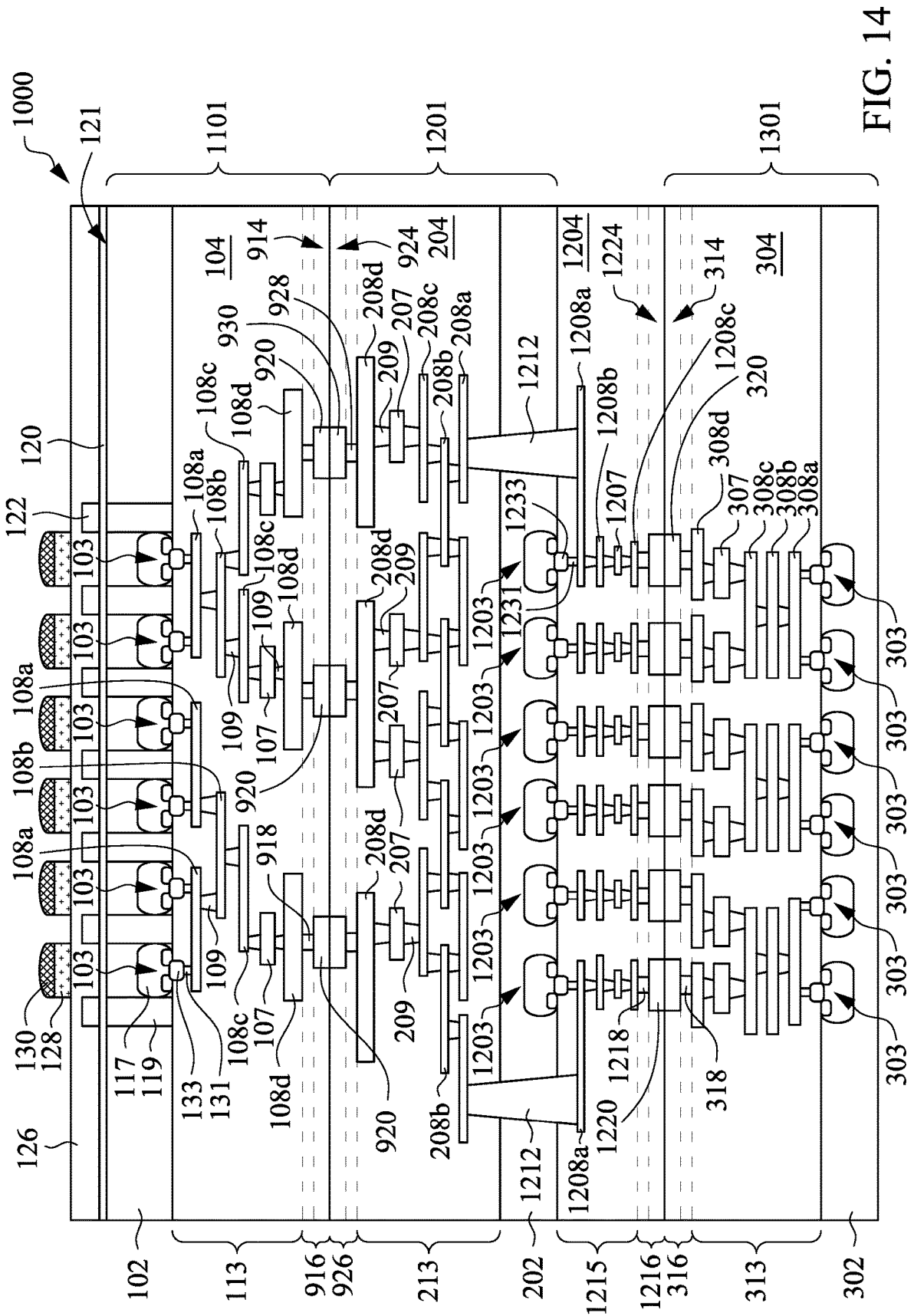

At operation 1510, after bonding the third semiconductor wafer 1301 to the second semiconductor wafer 1201, the structure shown in FIG. 13 is flipped over so that the backside 121 of the first substrate 102 of the first semiconductor wafer 101 is facing up. The high-k material 120 is formed over the backside 121 of the first substrate 102, the dielectric layer 126 and the metal grids 122 are then formed over the high-k material 120. Thereafter, color filters 128 and micro-lenses 130 are formed over the dielectric layer 126, as shown in FIG. 14. The high-k material 120, the dielectric layer 126, the metal grids 122, the color filters 128, and the micro-lenses 130 may be formed in a similar fashion as those discussed above with respect to FIG. 6.

Figure 16:
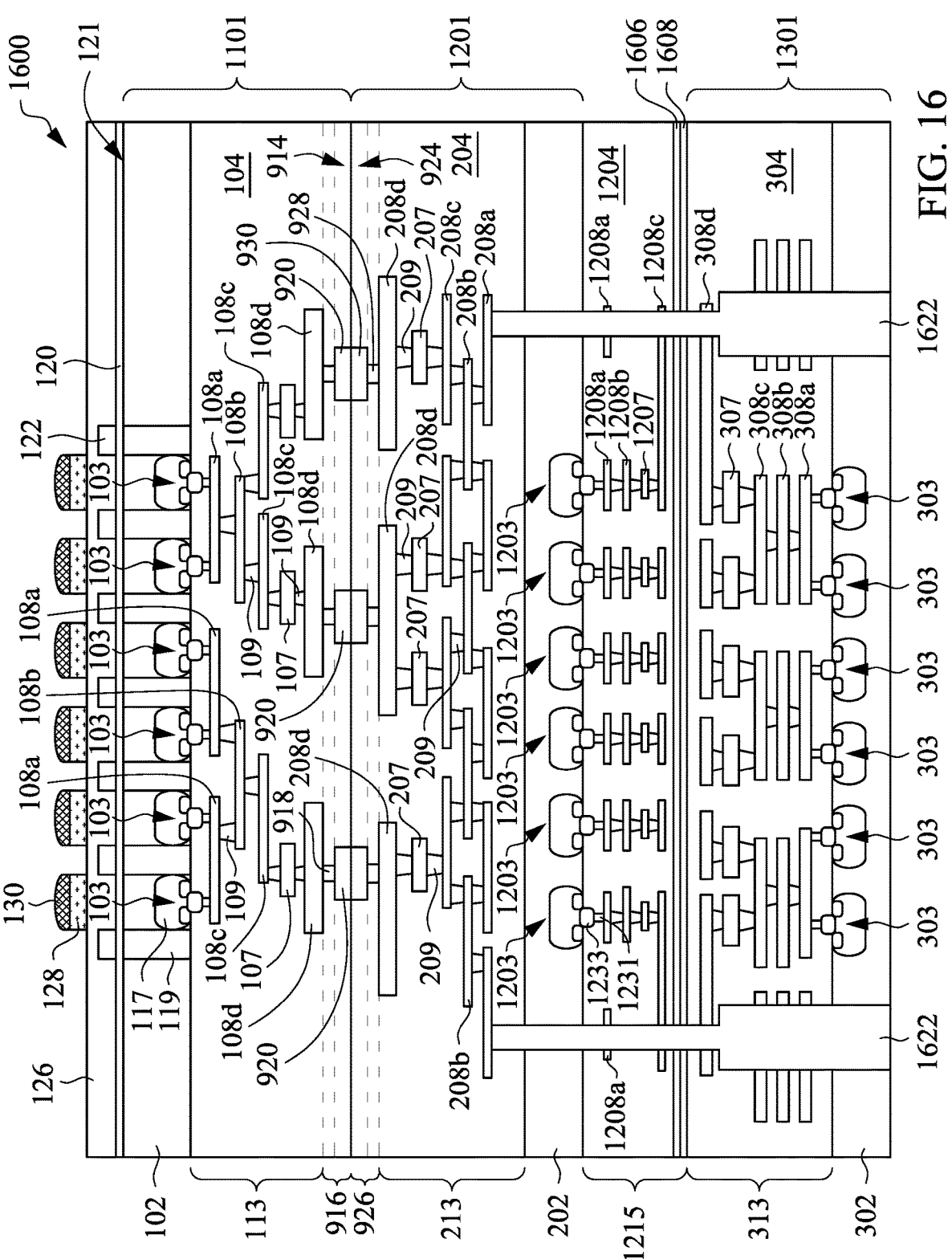
FIG. 16 is cross-sectional view of a semiconductor device in accordance with some embodiments of the present disclosure.

FIG. 16 is cross-sectional view of a semiconductor device 1600 in accordance with some embodiments of the present disclosure. The embodiment shown in FIG. 16 is substantially identical to that of FIG. 14 except that the backside BEOL structure 1215 and the third BEOL structure 313 are bonded together using dielectric-to-dielectric bonding technology by bonding a third bonding layer 1606 formed over the backside BEOL structure 125 to a fourth bonding layer 1608 formed over the third BEOL structure 313. The third and fourth bonding layers 1606, 1608 may be formed using the same material as the first and second bonding layers 106, 206. In one embodiment, the third and fourth bonding layers 1606, 1608 include SiON. In addition, through hole structures 1622, such as the first through hole structures 112, are formed extending from the third substrate 302 through the third IMD layers 304, the IMD layers 1204, the second substrate 202 to the second interconnects 208. The through hole structures 1622 therefore connect selected interconnects (e.g., second interconnects 208a at outer region of the second IMD layer 204) to selected interconnects (e.g., interconnects 1208c at outer region of the IMD layer 1204) and selected third interconnects 308 (e.g., third interconnects 308a at outer region of the third IMD layers 304), allowing for power and electrical/photodiode signals from the first semiconductor wafer 1101 to be distributed to various elements in the second and third semiconductor wafers 1201, 1301.

In the embodiments of FIGS. 14 and 16, the first semiconductor wafer 1101 may be a SOC wafer comprising semiconductor image sensors, the second semiconductor wafer 1201 may be a first ASIC wafer comprising a first logic circuit, and the third semiconductor wafer 1301 may be a second ASIC wafer comprising a second logic circuit. In some embodiments, the total number of the storage devices 207 in the second BEOL structure 213 is greater than the storage devices 107, 307 in the first and third BEOL structures 113, 313. The total numbers of the storage devices in the first BEOL structure, second BEOL structure, third BEOL structure, and backside BEOL structures 113, 213, 313, 1215 may be at a ratio of about 1:1.5:1:1 to about 1:2:1.5:1. The arrangement of the storage devices in the first BEOL, second BEOL, third BEOL, and backside BEOL structures 113, 213, 313, 1215 may be different from one another. In some embodiments, the storage devices 107 in the first BEOL structure 113 may be arranged in accordance with the embodiment shown in FIG. 2B or 2C, the storage devices 207 in the second BEOL and backside BEOL structures 213, 1215 may be arranged in accordance with the embodiment shown in FIG. 2A, and storage devices 307 in the third BEOL structure 313 may be arranged in accordance with the embodiment shown in FIG. 2B or 2C. In some embodiments, the storage devices 107 in the first BEOL structure 113 may be arranged in accordance with the embodiment shown in FIG. 2B or 2D, the storage devices 207 in the second BEOL and backside BEOL structures 213, 1215 may be arranged in accordance with the embodiment shown in FIG. 2A, and storage devices 307 in the third BEOL structure 313 may be arranged in accordance with the embodiment shown in FIG. 2B or 2D.

In addition, while embodiments of FIGS. 14 and 16 use third and fourth RDLs 914, 924 for bonding the first semiconductor wafer 1101 to the second semiconductor wafer 1201, the first and second semiconductor wafers 1101, 1201 may alternatively be bonded together using bonding layers, such as the first and second bonding layers 106, 206 as discussed above with respect to FIG. 6.

Various embodiments or examples described herein offer multiple advantages over the state-of-art technology. According to embodiments of the present disclosure, a three-dimensional (3D) stacked CMOS image sensor (CIS) device structure is provided. The CIS device structure includes at least a SOC wafer, a first ASIC wafer, and a second ASIC wafer. The first, second, and third wafers may be bonded together through a dielectric bonding structure, a redistribution layer (RDL) structure, or a hybrid bonding structure. One or more MIM capacitors are provided in the first, second, and third wafers between topmost metallization layer and a metal layer immediately adjacent the topmost metallization layer in BEOL structures of the first, second, and third wafers. Particularly, each MIM capacitor is connected to a thin-film transistor which electrically connects to pixel sensors of the SOC wafer for high speed frame rate storage and faster management of photodiode signals for image processing.

An embodiment is a semiconductor device. The semiconductor device includes a first semiconductor wafer comprising a first back-end-of-line (BEOL) structure disposed on a first side of a first substrate, the first BEOL structure comprising a first metallization layer disposed over the first substrate, a second metallization layer disposed over the first metallization layer, a first storage device disposed between the first and second metallization layers, and a first transistor contacting the first storage device, a first bonding layer disposed over the first BEOL structure. The semiconductor device also includes a second semiconductor wafer comprising a second BEOL structure disposed on a first side of a second substrate, the second BEOL structure comprising a third metallization layer disposed over the second substrate, a fourth metallization layer disposed over the third metallization layer, a second storage device disposed between the third and fourth metallization layers, and a second transistor contacting the second storage device. The semiconductor device further includes a second bonding layer disposed over the second BEOL structure and in contact with the first bonding layer.

Another embodiment is a semiconductor device. The semiconductor device includes a first semiconductor wafer, comprising a first back-end-of-line (BEOL) structure disposed on a first side of a first substrate, a plurality of first metal-insulator-metal (MIM) structures disposed in the first BEOL structure, and a first array of transistors disposed in the first substrate. The semiconductor device also includes a second semiconductor wafer comprising a second BEOL structure disposed on a first side of a second substrate, the second BEOL structure being directly bonded to the first BEOL structure through a first hybrid bonding structure, a plurality of second MIM structures disposed in the second BEOL structure, a third BEOL structure disposed on a second side of the second substrate, a plurality of third MIM structures disposed in the third BEOL structure, and a second array of transistors disposed in the second substrate on the second side. The semiconductor device further includes a third semiconductor wafer comprising a fourth BEOL structure disposed on a first side of a third substrate, the fourth BEOL structure being directly bonded to the third BEOL structure, a plurality of fourth MIM structures disposed in the fourth BEOL structure, and a third array of transistors disposed in the third substrate.

A further embodiment is a method for forming a semiconductor device. The method includes providing a first semiconductor wafer and a second semiconductor wafer, wherein the first semiconductor wafer comprises a first substrate, a first back-end-of-line (BEOL) structure formed over a first side of the first substrate, and a plurality of first logic circuits formed in the first substrate, and wherein the second semiconductor wafer comprises a second substrate and a second BEOL structure formed over a first side of the second substrate. The method also includes bonding the first BEOL structure to the second BEOL structure through a first hybrid bonding structure, forming a plurality of second logic circuits in the second substrate on a second side of the second substrate, and forming a third BEOL structure over the second side of the second substrate comprising forming a first metallization layer over the urality of second logic circuits, forming a metal-insulator-metal (MIM) structure over the first metallization layer, and forming a second metallization layer over the MIM structure. The method further includes bonding a fourth BEOL structure of a third semiconductor wafer to the third BEOL structure through a second hybrid bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:

providing a first semiconductor wafer and a second semiconductor wafer, wherein the first semiconductor wafer comprises a first substrate, a first back-end-of-line (BEOL) structure formed over a first side of the first substrate, and a plurality of first logic circuits formed in the first substrate, and wherein the second semiconductor wafer comprises a second substrate and a second BEOL structure formed over a first side of the second substrate;

bonding the first BEOL structure to the second BEOL structure through a first hybrid bonding structure; then after bonding the first BEOL structure to the second BEOL structure, forming a plurality of second logic circuits in a device-forming portion of the second substrate on a second side of the second substrate; and then forming a third BEOL structure over the second side of the second substrate, comprising:

depositing, in the third BEOL structure, a first metallization layer on the plurality of second logic circuits;

forming, within the third BEOL structure, a first metal-insulator-metal (MIM) structure disposed between two metallization layers and electrically coupled to the second logic circuits;

forming, in the third BEOL structure, a second metallization layer over the first MIM structure; and forming, within the third BEOL structure, a thin film transistor between and connected to the first MIM structure and the first metallization layer, wherein a source/drain node of the thin film transistor is in direct contact with the first MIM structure; and bonding a fourth BEOL structure of a third semiconductor wafer to the third BEOL structure through a second hybrid bonding structure.

2. The method of claim 1, further comprising:

forming micro-lenses over a second side of the first substrate.

3. The method of claim 1, further comprising:

after forming a plurality of second logic circuits in the device-forming portion of the second substrate, forming through hole structures connecting the first metallization layer to an interconnect in the second BEOL structure.

4. The method of claim 3, wherein the through hole structures comprises through-silicon-via (TSV), through-oxide-via (TOV), through-insulator-via (TIV), or big through-silicon-via (BTSV).

5. The method of claim 1, wherein each of the first and second hybrid bonding structures comprises a first redistribution layer (RDL) and a second RDL.

6. The method of claim 5, wherein the first RDL and the second RDL are bonded together by an insulator-to-insulator and a metal-to-metal hybrid bonding technology.

7. The method of claim 1, wherein the first BEOL structure comprises a second MIM structure, the third BEOL structure comprises a third MIM structure, and the fourth BEOL structure comprises a fourth MIM structure.

8. A method for forming a semiconductor device, comprising:

forming a first wafer comprising a first substrate and a first back-end-of-line (BEOL) structure over the first substrate, wherein the first BEOL structure comprises a first metal-insulator-metal (MIM) structure and a thin film transistor, wherein, the first MIM structure is formed between a first interconnect and a second interconnect in first metallization layers of the first BEOL structure, and the thin film transistor is formed between and connected to the first MIM structure and the first interconnect, wherein a source/drain node of the thin film transistor is in direct contact with the first MIM structure;

forming a second wafer comprising a second substrate and a second BEOL structure over the second substrate, wherein the second BEOL structure comprises a second MIM structure;

forming a first hybrid bonding structure, wherein the first hybrid bonding structure is spatially separated from the first MIM structure;

bonding the first BEOL structure to the second BEOL structure through the first hybrid bonding structure; then flipping the second wafer to expose a backside of the second substrate; then forming electrical circuits on the backside of the second substrate; then forming a backside BEOL structure on the electrical circuits;

forming a third wafer comprising a third substrate and a third BEOL structure, wherein the third BEOL structure comprises a third MIM structure;

forming a second hybrid bonding structure, wherein the second hybrid bonding structure is spatially separated from the third MIM structure; and bonding the third BEOL structure to the backside BEOL structure of the second wafer through the second hybrid bonding structure.

9. The method of claim 8, further comprising:

flipping the third wafer to expose a backside of the first substrate; and forming micro-lenses over the backside of the first substrate.

10. The method of claim 8, further comprising:

after flipping the second wafer, thinning down the thickness of the second substrate.

11. The method of claim 8, wherein the second MIM structure is formed between a third interconnect and a fourth interconnect in second metallization layers of the second BEOL structure, and the second metallization layers are disposed immediately adjacent to the interface defined by the first BEOL structure and the second BEOL structure.

12. The method of claim 11, wherein the third MIM structure is formed between a fifth interconnect and a sixth interconnect in third metallization layers of the third BEOL structure, and the third metallization layers are disposed immediately adjacent to an interface defined by the third BEOL structure and the backside BEOL structure.

13. The method of claim 12, further comprising:

forming a fourth MIM structure in the backside BEOL structure, and the fourth MIM structure is formed between a seventh interconnect and an eighth interconnect in fourth metallization layers of the backside BEOL structure, and the fourth metallization layers are disposed immediately adjacent to an interface defined by the backside BEOL structure and the third BEOL structure.

14. The method of claim 8, wherein the first wafer is a System-on-Chip (SOC) wafer comprising an array of pixel sensors, the second wafer is a first Application-Specific Integrated Circuit (ASIC) wafer, and the third wafer is a second ASIC wafer.

15. The method of claim 8, further comprising:

after forming the backside BEOL structure over the electrical circuits, forming through hole structures connecting a ninth interconnect in the fourth metallization layers of the backside BEOL structure to a tenth interconnect in the second BEOL structure.

16. The method of claim 8, wherein the first hybrid bonding structure further comprises first redistribution layers (RDL), and the second hybrid bonding structure further comprises second redistribution layers.

17. A method for forming a semiconductor device, comprising:

bonding a System-on-Chip (SOC) wafer to a front side of a first Application-Specific Integrated Circuit (ASIC) wafer through a hybrid bonding structure, wherein the SOC wafer comprises a first transistor and a first metal-insulator-metal (MIM) structure, the first ASIC wafer comprises a second MIM structure, and the first and second MIM structures are disposed adjacent to a first interface defined by the SOC wafer and the first ASIC wafer;

forming a second transistor on a backside of the first ASIC wafer after bonding the SOC wafer to the first ASIC wafer;

forming a backside BEOL structure on the backside of the first ASIC wafer, comprising:

forming a plurality of inter-metal dielectric (IMD) layers and first interconnects in the IMD layers on the second transistor;

forming a third MIM structure between two immediately adjacent first interconnects of the first interconnects, wherein the two immediately adjacent first interconnects are disposed in the backside BEOL structure at a level away from the backside of the first ASIC wafer and the hybrid bonding structure; and connecting a thin film transistor to the third MIM structure, wherein the thin film transistor is formed between and connected to the third MIM structure and one of the two immediately adjacent first interconnects, and a source/drain node of the thin film transistor is in direct contact with the third MIM structure;

bonding a second ASIC wafer to the backside BEOL structure, wherein the second ASIC wafer comprises a fourth MIM structures disposed adjacent to a second interface defined by the backside BEOL structure and the second ASIC wafer; and forming micro-lenses over a backside of the SOC wafer.

18. The method of claim 17, further comprising:

forming through hole structures each extending from the backside BEOL structure to the first ASIC wafer, wherein the through hole structures are in electrical connection with the third MIM structure and the second MIM structure.

* * * * *